United States Patent
Kato

(10) Patent No.: US 10,592,791 B2
(45) Date of Patent: Mar. 17, 2020

(54) IMAGE PROCESSING APPARATUS, IMAGE PROCESSING METHOD, AND STORAGE MEDIUM WITH OBTAINING OF RESISTANCE INFORMATION RELATING TO RESISTANCE VALUE OF PRINT IMAGE

(71) Applicant: CANON KABUSHIKI KAISHA, Tokyo (JP)

(72) Inventor: Minako Kato, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/025,250

(22) Filed: Jul. 2, 2018

(65) Prior Publication Data
US 2019/0019070 A1    Jan. 17, 2019

(30) Foreign Application Priority Data
Jul. 13, 2017   (JP) .................................. 2017-136994

(51) Int. Cl.
| | | |
|---|---|---|
| G06K 15/00 | (2006.01) | |
| G06F 3/12 | (2006.01) | |
| G06K 15/10 | (2006.01) | |
| G06K 15/02 | (2006.01) | |

(52) U.S. Cl.
CPC ....... *G06K 15/4075* (2013.01); *G06F 3/1208* (2013.01); *G06F 3/1253* (2013.01); *G06K 15/105* (2013.01); *G06K 15/107* (2013.01); *G06K 15/1868* (2013.01)

(58) Field of Classification Search
None
See application file for complete search history.

(56) References Cited

U.S. PATENT DOCUMENTS

| | | | |
|---|---|---|---|
| 6,292,621 B1 | 9/2001 | Tanaka et al. | |
| 7,432,985 B2 | 10/2008 | Ishikawa et al. | |
| 9,135,523 B2 | 9/2015 | Kato et al. | |
| 2014/0125725 A1* | 5/2014 | Sakai | B41J 2/2114 347/15 |
| 2016/0086904 A1* | 3/2016 | Jakob | H01L 25/0657 257/737 |

FOREIGN PATENT DOCUMENTS

| | | |
|---|---|---|
| JP | 2012-197487 A | 10/2012 |
| JP | 5690180 B2 | 3/2015 |
| JP | 2015-179693 A | 10/2015 |

* cited by examiner

*Primary Examiner* — Andrew H Lam
(74) *Attorney, Agent, or Firm* — Venable LLP

(57) ABSTRACT

Provided are an image processing apparatus, an image processing method, and a storage medium that can contribute to formation of electric circuits having different resistance values without causing increase in cost. The image processing apparatus generates print data for printing an electrically conductive print image on a print medium by ejecting a metal particle-containing ink from ejection device, the image processing apparatus has: a setting unit configured to set a printing condition based on a resistance value of the electrically conductive print image so as to change at least one of an amount of ink droplets of the metal particle-containing ink contacting each other and a time to be taken for ejected metal particle-containing ink droplets to contact each other; and a generation unit configured to generate the print data based on image data for the electrically conductive print image and the printing condition.

25 Claims, 22 Drawing Sheets

IMAGE PROCESSING APPARATUS, IMAGE PROCESSING METHOD, AND STORAGE MEDIUM WITH OBTAINING OF RESISTANCE INFORMATION RELATING TO RESISTANCE VALUE OF PRINT IMAGE

BACKGROUND OF THE INVENTION

Field of the Invention

The present invention relates to an image processing apparatus for, an image processing method of, and a storage medium for generating print data for printing a given image with an inkjet printing apparatus.

Description of the Related Art

Japanese Patent No. 5690180 discloses a technique of forming an electric circuit on a print medium with an inkjet printing apparatus or the like by using an ink having electrical conductivity (hereinafter, referred to as "electrically conductive ink").

According to a technique disclosed in Japanese Patent Laid-Open No. 2015-179693, electric circuits with different resistance values (electrical resistivities), for example, can be formed by using electrically conductive inks with different characteristics. In this case, however, it is necessary to prepare a plurality of electrically conductive inks that exhibit different resistance values. This causes increase in cost.

SUMMARY OF THE INVENTION

The present invention has been made in view of the above problem and an object thereof is to provide an image processing apparatus, an image processing method, and a storage medium that can contribute to formation of electric circuits having different resistance values without causing increase in cost.

In the first aspect of the present invention, there is provided an image processing apparatus for generating print data for printing an electrically conductive print image on a print medium by ejecting a metal particle-containing ink from ejection device, comprising: a setting unit configured to set a printing condition based on a resistance value of the electrically conductive print image so as to change at least one of an amount of ink droplets of the metal particle-containing ink contacting each other and a time to be taken for ejected metal particle-containing ink droplets to contact each other; and a generation unit configured to generate the print data based on image data for the electrically conductive print image and the printing condition.

In the second aspect of the present invention, there is provided an image processing method for generating print data for printing an electrically conductive print image on a print medium by ejecting a metal particle-containing ink from ejection device, comprising: a setting step of setting a printing condition based on a resistance value of the electrically conductive print image so as to change at least one of an amount of ink droplets of the metal particle-containing ink contacting each other and a time to be taken for ejected metal particle-containing ink droplets to contact each other; and a generation step of generating the print data based on image data for the electrically conductive print image and the printing condition.

In the third aspect of the present invention, there is provided a non-transitory computer readable storage medium storing a program for causing a computer to perform an image processing method for generating print data for printing an electrically conductive print image on a print medium by ejecting a metal particle-containing ink from ejection device, the method comprising: a setting step of setting a printing condition based on a resistance value of the electrically conductive print image so as to change at least one of an amount of ink droplets of the metal particle-containing ink contacting each other and a time to be taken for ejected metal particle-containing ink droplets to contact each other; and a generation step of generating the print data based on image data for the electrically conduction print image and the printing condition.

According to the present invention, it is possible to generate pieces of print data for forming electric circuits exhibiting different resistance values by using a single electrically conductive ink (metal particle-containing ink).

Further features of the present invention will become apparent from the following description of exemplary embodiments with reference to the attached drawings.

DESCRIPTION OF THE EMBODIMENTS

Some examples of an image processing apparatus, an image processing method, and a storage medium according to the present invention will be described below in detail with reference to the accompanying drawings.

First Embodiment

Figure 1:
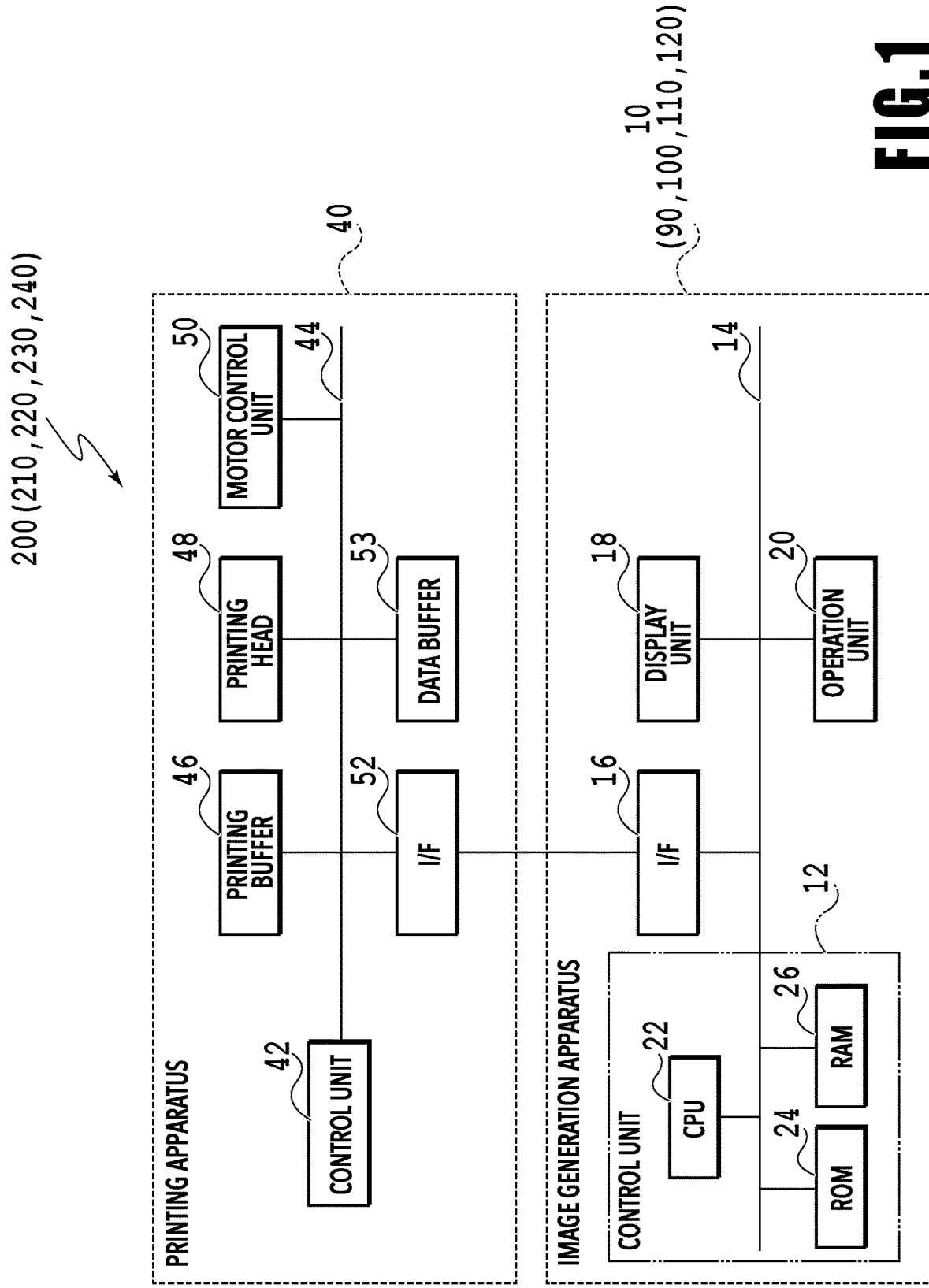
FIG. 1 is a block diagram of an image formation apparatus including an image generation apparatus according to the present invention.

First, a first embodiment of the image processing apparatus according to the present invention will be described with reference to FIG. 1 to FIG. 10. Here, FIG. 1 illustrates a block diagram illustrating main components of the image formation apparatus according to the present invention. An image generation apparatus 10 (image processing apparatus) according to the first embodiment is connected to an inkjet printing apparatus (hereinafter, referred to as "printing apparatus" as appropriate) 40 to configure an image formation apparatus 200 that prints an electric circuit image on a print medium to thereby form an electric circuit on the print medium.

More specifically, the image generation apparatus 10 includes a control unit 12 that controls all operations of the image generation apparatus 10, such as generation of image data. An interface (I/F) 16 for connecting to the printing apparatus 40, a display unit 18 for displaying various pieces of information, and an operation unit 20 to be operated by the user are connected to this control unit 12 by a bus 14. The operation unit 20 is, for example, a letter input device such as a keyboard, a pointing device such as a mouse, and/or the like. Meanwhile, the display unit 18 may be used as the operation unit 20 by equipping the display unit 18 with a touchscreen function. Note that such an image generation apparatus 10 may be configured of a general-purpose personal computer or a mobile computer terminal such as a smartphone or a tablet PC, for example.

The control unit 12 includes a central processing unit (CPU) 22 that executes various processes. An ROM 24 which stores a program for this CPU 22 to execute the various processes and an RAM 26 as a working area in which various registers and so on necessary when the CPU 22 executes the program are set are connected to the CPU 22. Further, the control unit 12, including these CPU 22, ROM 24, RAM 26, and so on, generates print data for printing an electric circuit image.

Figure 2:
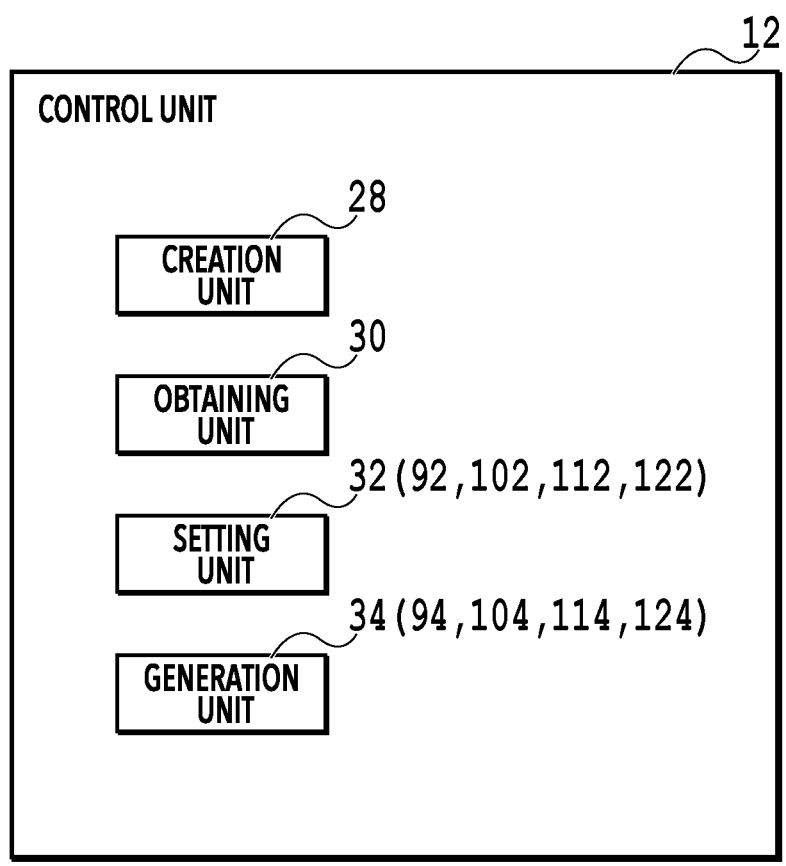
FIG. 2 is a block diagram illustrating functional components of a control unit in the image generation apparatus according to the present invention.

Now, functional components of the control unit 12 will be described with reference to FIG. 2. Here, FIG. 2 illustrates a block diagram illustrating the functional components of the control unit 12. In addition to various publicly known components such as a component that controls the contents to be displayed on the display unit 18, the control unit 12 includes a creation unit 28 that creates an electric circuit diagram (hereinafter, referred to as "circuit diagram") based on input information. The control unit 12 also includes an obtaining unit 30 that obtains a print image to be printed by the printing apparatus 40 based on the circuit diagram and size information, and a setting unit 32 that sets a printing condition necessary for exhibiting a set resistance value. The control unit 12 further includes a generation unit 34 that generates print data for printing the electric circuit image with the printing apparatus 40 under the set printing condition.

Figure 3A:
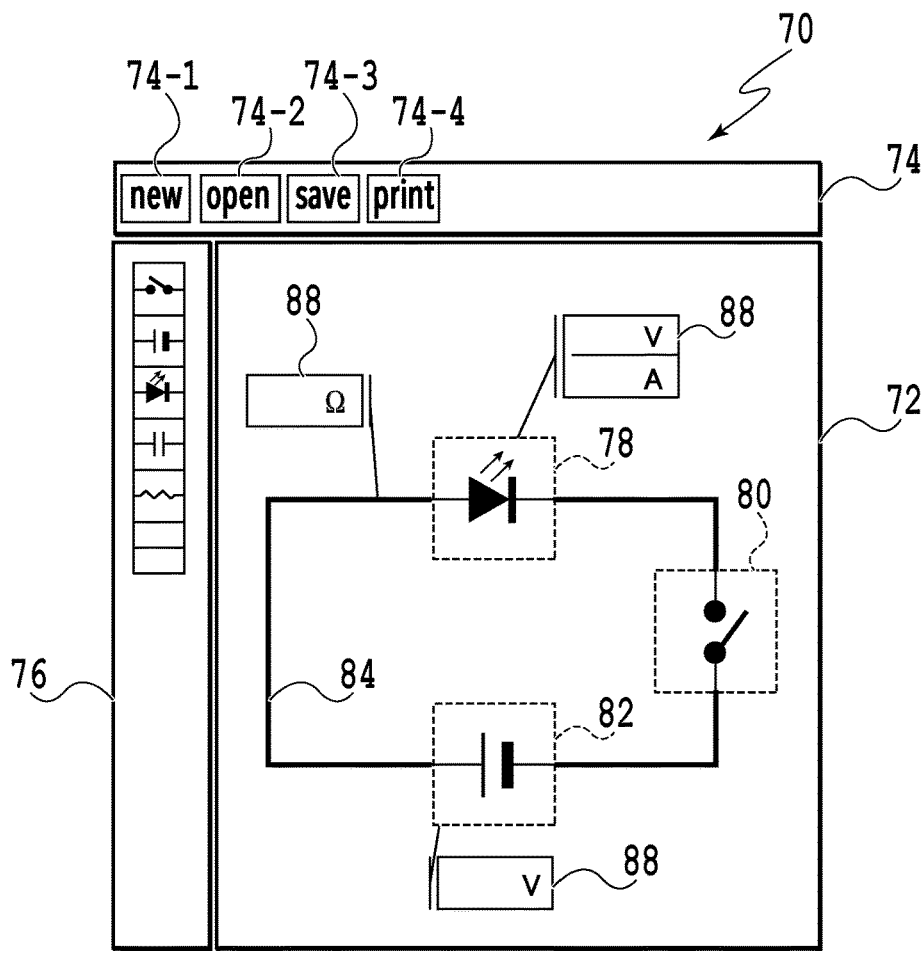
FIG. 3A and FIG. 3B are explanatory diagrams each illustrating an example of displayed objects on a display unit.
Figure 3B:
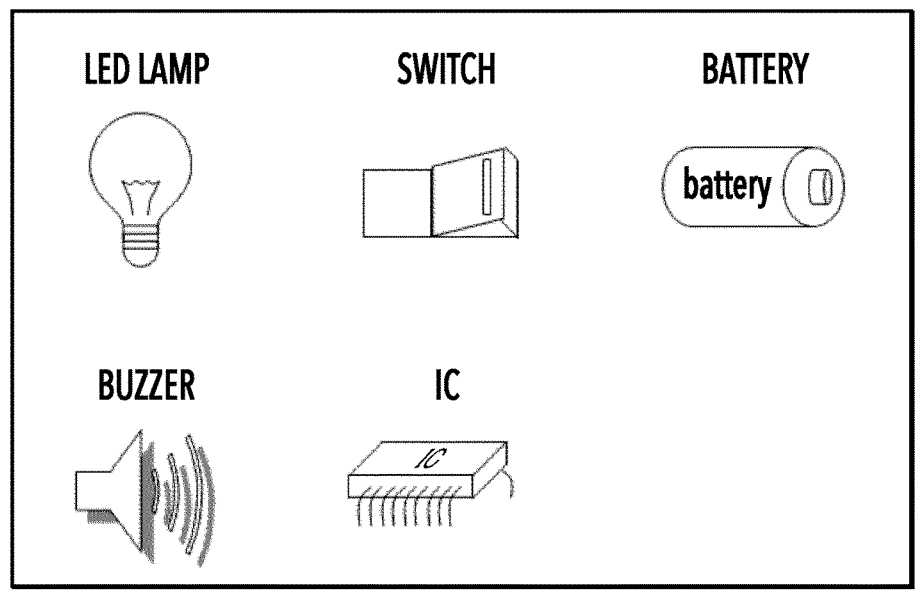

More specifically, the creation unit 28 displays a circuit diagram creation screen for the user to create a circuit diagram on the display unit 18. Moreover, the creation unit 28 creates a circuit diagram based on information input through the circuit diagram creation screen and determines the size of the circuit diagram. Specifically, as illustrated in FIG. 3A, a circuit diagram creation screen 70 includes a circuit diagram display portion 72 in which the circuit diagram to be created is displayed, an operation display portion 74 in which selectable operations are displayed, and a part display portion 76 in which parts (components) selectable for the circuit diagram to be created are displayed.

Operations executable for creation of a circuit diagram and so on are displayed in the operation display portion 74. For example, a "new" button 74-1 for creating a new circuit diagram and an "open" button 74-2 for opening a previously stored circuit diagram are displayed. Moreover, a "save" button 74-3 for saving a created circuit diagram and a "print" button 74-4 for generating print data from a created circuit diagram and so on and outputting the generated print data to the printing apparatus 40 to print it with the printing apparatus 40 are displayed.

Also, parts usable to create a circuit diagram such for example as a switch, a power supply, and an LED lamp are displayed in the part display portion 76. Note that the display form of the parts in the part display portion 76 is not limited to symbols as in FIG. 3A. Specifically, the parts may be displayed as icons in the part display portion 76 as in FIG. 3B and may be displayed in any form as long as it is recognizable to the user. Also, the part display portion 76 is a portion in which to display various parts that constitute an electric circuit, and the parts are limited neither to those displayed in FIG. 3A nor to those displayed in FIG. 3B.

A circuit diagram is displayable in the circuit diagram display portion 72. The user creates a circuit diagram while referring to the circuit diagram display portion 72. Specifically, the user selects a part to be used from among the parts displayed in the part display portion 76 and places the selected part at any suitable position in the circuit diagram display portion 72 to create a desired circuit diagram. Note that the following description will be given based on a case of creating a circuit diagram in which an LED lamp 78, a switch 80, and a battery 82 are connected in series by a wiring 84, as illustrated in FIG. 3A.

After completing the arrangement of the parts in the circuit diagram, the user inputs the property value of each part. Here, when a part is selected, an input section 88 in which to input its property value is displayed, and the property value of the selected part is input into the displayed input section 88. The property value to be input is set to the property value of the part to be actually used. For example, in a case of using two 3-V lithium coin batteries as the battery 82, the user selects the battery 82 displayed in the circuit diagram display portion 72 to display its input section 88 and inputs a set value "6 V" into the displayed input section 88. Also, for the LED lamp 78, a voltage value and a current value are set as its set values. Specifically, the user selects the LED lamp 78 displayed in the circuit diagram display portion 72 to display its input section 88 and, if the LED lamp 78 is, for example, a white LED lamp, inputs a voltage value (forward voltage) "3.5 V" and a current value "20 mA."

Note that the setting of a property value(s) is not limited to the above method. Specifically, each part displayed in the part display portion 76 may be associated with model number information. Then, when a part is selected, a plurality of model numbers may be displayed and the user may select any model number to set a property value(s) corresponding to the model number.

Also, a property value is set for the wiring 84 as well. Specifically, as the property value of the wiring 84, which is an image to be printed with a metal particle-containing ink (print image), its resistance value is set.

Here, it is important to control the resistance value in an electric circuit. With an inappropriate resistance value, electric components disposed in the electric circuit may fail to operate properly. For example, an LED lamp has polarity and operates only when voltage is applied in a predetermined direction. This voltage will be denoted as forward voltage "VF." Also, when the applied voltage is low, current does not flow through an LED lamp but when the applied voltage is higher than a certain voltage, current flows through the LED lamp, thereby lighting the LED lamp. The current value in this state will be denoted as "IF." As the forward voltage VF becomes higher, the current value IF becomes higher and the LED lamp is lit more brightly. However, excessively raising the current value IF may break the LED lamp. For this reason, in forming an electric circuit that lights an LED lamp, a resistive element to limit the current value IF is usually disposed. A resistance value R necessary to limit the current value IF is expressed by equation (1) below, where "E" is a power supply voltage.

$$R=(E-VF)/IF \quad (1)$$

As described above, in a case of using an LED lamp, an appropriate resistance value needs to be added based on the power supply voltage to be used, the current value IF to be caused to flow through the LED lamp, and the forward voltage VF in that state. The relationship between the forward voltage VF and the current value IF differs from one product to another. For example, there are many products which require higher voltage for blue and white LED lamps than for red and green LED lamps. When an electric circuit is actually formed, it must be a circuit that obtains an appropriate resistance value for the type and number of LED lamps to be used and how they are connected (series vs parallel).

The wiring resistance in an electric circuit is negligibly small if a copper wiring is used as its wiring. However, the wiring resistance is not negligible if the wiring is formed with a metal particle-containing ink. Utilizing such a nature of a print object formed with a metal particle-containing ink, the present invention obtains a resistance for limiting the current value for proper operation of an LED lamp by means of wiring resistance.

In other words, a circuit diagram generated by this image generation apparatus 10 will exhibit a resistance value for limiting the current for proper operation of the LED lamp 78 by using the wiring resistance of the wiring 84, without any resistive element disposed. The creation unit 28 calculates and sets the resistance value of the wiring 84 based on the property values of the battery 82 and the LED lamp 78. Specifically, in a case of using a 6-V battery 82 and a 3.5-V 20-mA LED lamp 78, (6-3.5)/0.02=125 according to equation (1), so that the resistance value is 125Ω.

Note that although a white LED lamp is used as the LED lamp 78 in the above description, a red LED lamp may be used instead. The property values of a red LED lamp are, for example, a voltage value of "2 V" and a current value of "20 mA." In this case, the power supply necessary to drive the LED lamp 78 is 2 V, and the battery 82 is therefore changed to one lithium coin battery. Then, "3 V" is input as the set value of the battery 82, so that the resistance value of the wiring 84 is calculated to be 50Ω.

Although the creation unit 28 calculates the resistance value of the wiring 84, the present invention is not limited to this. Specifically, the user may calculate the resistance value and input the calculated resistance value into the input section 88 for the wiring 84. Note that in this case, the user may not input the property values of the battery 82 and the LED lamp 78.

Figure 4:
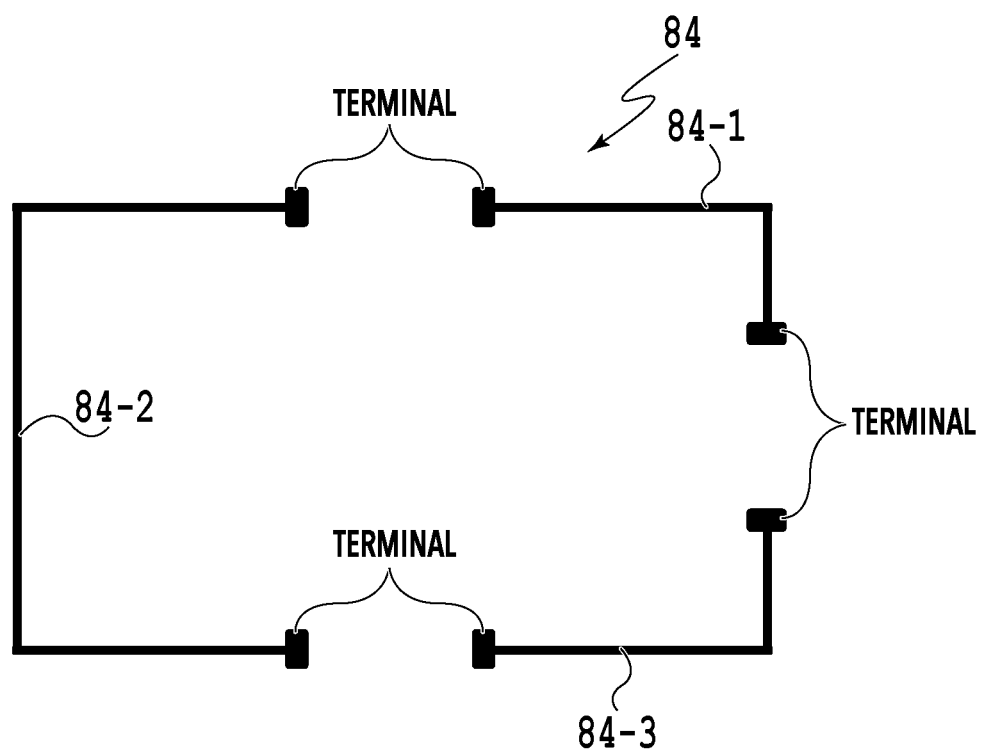
FIG. 4 is an explanatory diagram of an electric circuit.

The obtaining unit 30 obtains a print image to be printed by the printing apparatus using a metal particle-containing ink, which is an electrically conductive ink, based on size information input by the user and the circuit diagram created by the creation unit 28. Note that the metal particle-containing ink is an ink containing metal particles and is, for example, the ink disclosed in Japanese Patent No. 5690180, and a print object will be electrically conductive. The size information is determined and input by the user based on the size of the print medium. The upper and lower limits of inputtable size information are the maximum and minimum sizes printable by the printing apparatus 40. The sizes printable by the printing apparatus 40 are determined by the distance of movement of a carriage 60 in the main scanning direction, the structure of a conveying mechanism, and so on. In the print image obtained by the obtaining unit 30, the wiring 84 to be printed with the metal particle-containing ink is extracted while the portions where the other parts are to be disposed are blanked, as illustrated in FIG. 4. In doing so, terminals are formed at the portions of the wiring 84 to be connected to the other parts.

The setting unit 32 sets a printing condition for exhibiting the set resistance value. Now, the relationship between the printing condition and the resistance value will be described with reference to FIG. 5A to FIG. 6G. FIG. 5A, FIG. 5B, FIG. 5C, FIG. 5D, FIG. 5E, and FIG. 5F illustrate explanatory diagrams illustrating states of dot formation at a position where metal particle-containing ink droplets landing at the same time contact each other and at a position where metal particle-containing ink droplets landing at the same time do not contact with each other. FIG. 6A, FIG. 6B, FIG. 6C, FIG. 6D, FIG. 6E, FIG. 6F, and FIG. 6G illustrate explanatory diagrams illustrating states of dot formation at a position where metal particle-containing ink droplets landing at different times contact each other.

Figure 5A:
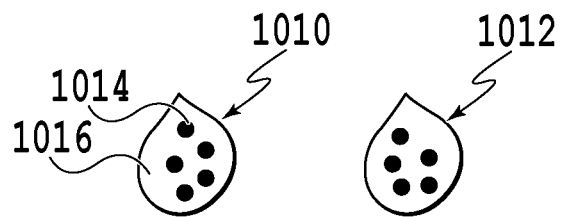
FIG. 5A, FIG. 5B, FIG. 5C, FIG. 5D, FIG. 5E, and FIG. 5F are explanatory diagrams explaining the electric conductivities of print objects with different ink droplet landing positions.
Figure 5B:
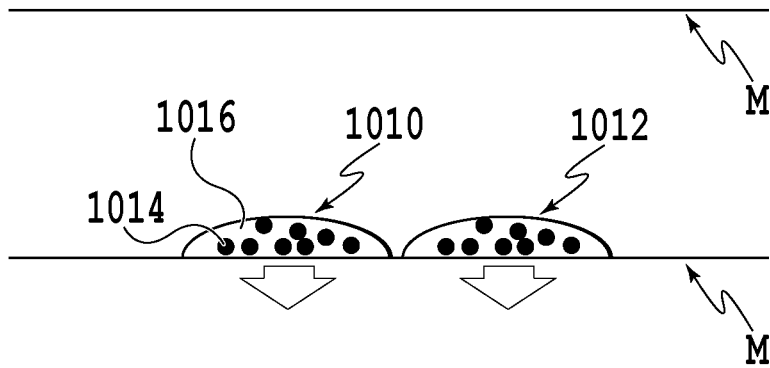
Figure 5C:
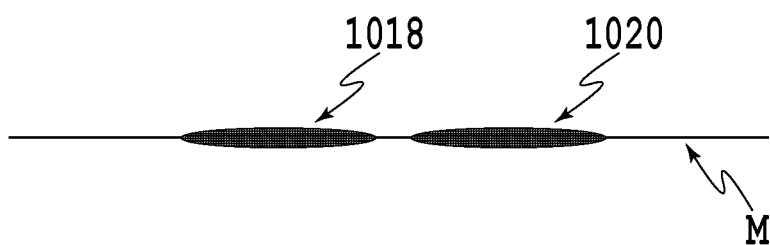
Figure 5D:
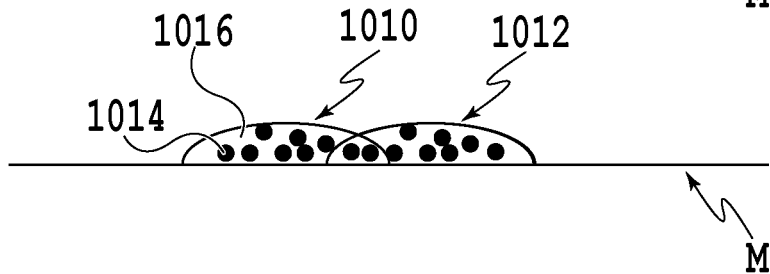

First, description will be given of a case where two ink droplets 1010 and 1012 of the metal particle-containing ink with the same volume ejected from a printing head 48 (ejection device) land on a print medium M at the same time, with reference to FIG. 5A to FIG. 5F. As illustrated in FIG. 5A, ink droplets 1010 and 1012 each contain metal particles 1014 and a solvent 1016. If the two ink droplets 1010 and 1012 do not contact each other when landing on the print medium M, the solvent 1016 of the ink droplets 1010 and 1012 having landed infiltrates into the print medium M, as illustrated in FIG. 5B, while also evaporating from the ink droplet surfaces. As the solvent 1016 decreases due to the infiltration and the evaporation, the metal particles 1014 form films (dots) 1018 and 1020 on the print medium M, as illustrated in FIG. 5C. Note that some of the metal particles 1014 in the ink droplets 1010 and 1012 get into the print medium M as the solvent 1016 infiltrates into the print medium M.

Figure 5E:
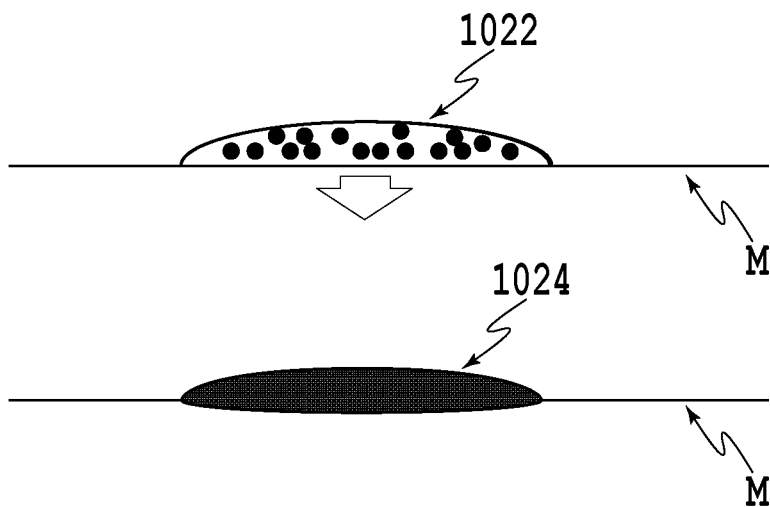
Figure 5F:
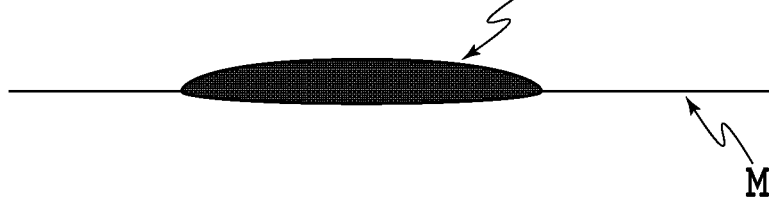

On the other hand, if the two ink droplets 1010 and 1012 contact each other when landing on the print medium M (see FIG. 5D), the ink droplets 1010 and 1012 are united by their surface tensions and form a single ink droplet 1022 on the print medium M, as illustrated in FIG. 5E. Then, as the solvent infiltrates into the print medium M and evaporates from the ink droplet surface, the ink droplet 1022 forms a dot 1024, as illustrated in FIG. 5F. Here, the volume of the ink droplet 1022 is equal to the sum of the volumes of the ink droplets 1010 and 1012. On the other hand, the area of contact of the ink droplet 1022 with the print medium M (see FIG. 5E) is small as compared to the sum of the areas of contact of the ink droplets 1010 and 1012 with the print medium M (see FIG. 5D). Accordingly, the proportion of the metal particles in the ink droplet 1022 infiltrating into the print medium M is smaller and therefore more metal particles remain on the print medium. Since it is the metal particles that make the print object electrically conductive, the more metal particles are present on the print medium, the higher the electrical conductivity will be, i.e. the lower the resistance value will be. Then, by controlling the amount of ink droplets contacting each other, it is possible to control the state of dot formation and adjust the resistance value to be exhibited by the print object. Note that the amount of ink droplets contacting each other represents the number of ink droplets contacting with another ink droplet(s) and the volume by which an ink droplet contacts another ink droplet(s), and is adjusted based on an ink amount added per unit area, for example.

Figure 6A:
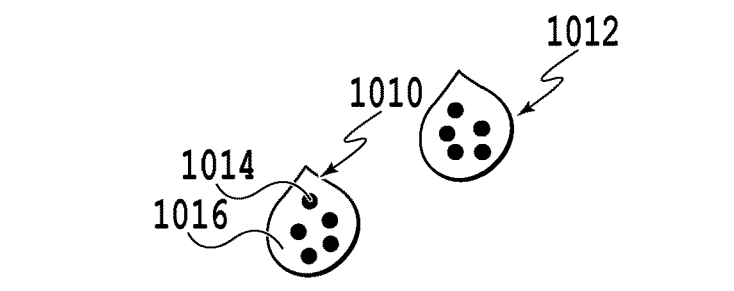
FIG. 6A, FIG. 6B, FIG. 6C, FIG. 6D, FIG. 6E, FIG. 6F, and FIG. 6G are explanatory diagrams explaining the electric conductivities of print objects with different ink droplet landing timings.
Figure 6B:
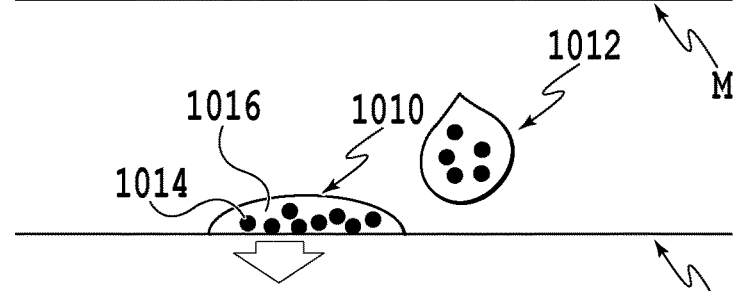
Figure 6C:
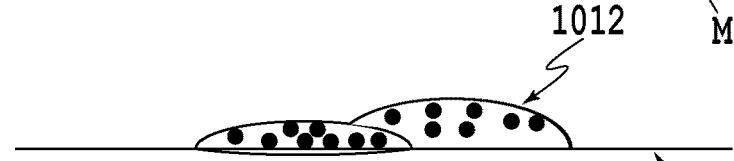
Figure 6D:
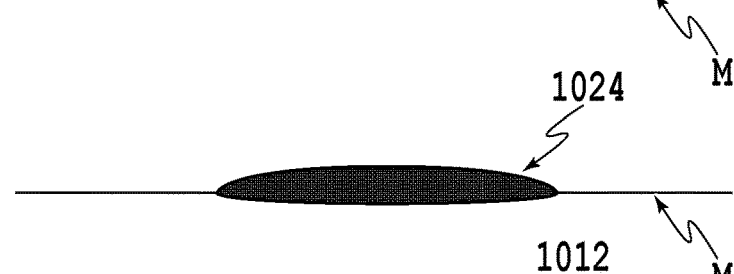
Figure 6E:
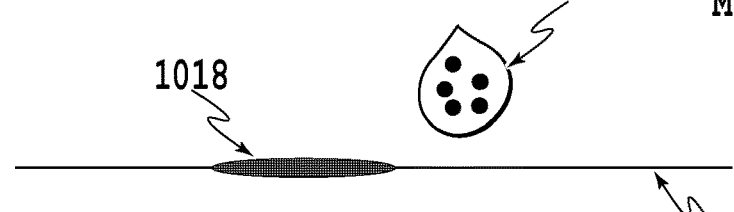

Next, description will be given of a case where two ink droplets 1010 and 1012 of the metal particle-containing ink with the same volume ejected from the printing head 48 land on a print medium M at different times, with reference to FIG. 6A to FIG. 6G. As illustrated in FIG. 6A, the ink droplets 1010 and 1012 each contain metal particles 1014 and a solvent 1016. The ink droplet 1010 lands on the print medium M earlier than the ink droplet 1012, as illustrated in FIG. 6B. The solvent 1016 of the ink droplet 1010, which has landed first, infiltrates into the print medium M while also evaporating from the ink droplet surface. As the solvent decreases, the metal particles 1014 form a dot 1018 on the print medium M. Before such a dot 1018 is formed, the ink droplet 1012 lands on the print medium M so as to contact the ink droplet 1010 (see FIG. 6C). As a result, the ink droplets are united by their surface tensions and form a single ink droplet 1022 as illustrated in FIG. 5E. Here, the area of contact of the ink droplet 1022 thus formed with the print medium M is smaller than the sum of the areas of contact of the ink droplets 1010 and 1012 contacting the print medium M individually. Then, as the solvent 1016 infiltrates into the print medium M and evaporates from the ink droplet surface, the ink droplet 1022 forms a dot 1024, as illustrated in FIG. 6D.

Figure 6F:
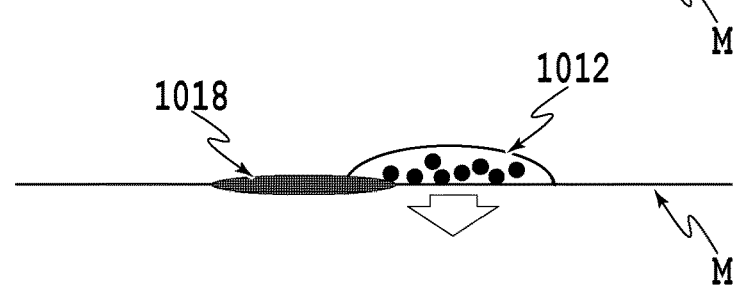
Figure 6G:
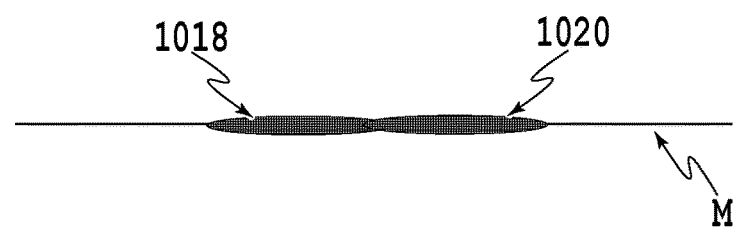

On the other hand, if the dot 1018 has been formed (see FIG. 6E) and then the ink droplet 1012 lands on the print medium M so as to contact the dot 1018 (see FIG. 6F), the surface tension of the other ink droplet will not act on the ink droplet 1012. Specifically, in this case, the ink droplet 1012 lands on the print medium M in a similar manner to the ink droplet 1012 landing on the print medium M without contacting the ink droplet 1010 (see FIG. 5B), while overlapping the dot 1018. Hence, the area of contact of the ink droplets 1010 and 1012 with the print medium M in FIG. 6F is smaller by the area of the overlap yet is close to the areas of contact of the ink droplets 1010 and 1012 landing on the print medium M without contacting each other (see FIG. 5B). Thus, the area of contact with the print medium M is larger in the case where the ink droplet 1012 lands after the dot 1018 is formed than in the case where the ink droplet 1012 lands before the dot 1018 is formed, and the amount of metal particles infiltrating into the print medium is accordingly larger.

As described above, more metal particles remain on a print medium when two ink droplets are united and form a dot than when two ink droplets individually form dots. Thus, a print object will have higher electrical conductivity, i.e. a lower resistance value in the case where a following ink droplet lands before a first landing ink droplet forms a dot than in the case where the following ink droplet lands after the first landing ink droplet forms a dot. Specifically, the shorter the interval between the landing times of two ink droplets landing in proximity to each other, the larger the portion of the first landing ink droplet will remain in the liquid state on the print medium and get united with the following ink droplet and therefore the higher the electrical conductivity of the print object will be. Then, by controlling the timings of landing of ink droplets, it is possible to control the time to be taken for ejected ink droplets to contact each other. This in turn makes it possible to control the state of dot formation and adjust the resistance value to be exhibited by the print object.

Based on a phenomenon as described above, the setting unit 32 sets the printing condition in accordance with the set resistance value of the wiring 84. Specifically, to make the resistance value of the wiring 84 small, ink droplets are brought into contact with each other to produce a large ink droplet. More specifically, ink droplets are brought into contact with each other and also the following ink droplet is caused to land before the preceding ink droplet forms a dot. On the other hand, to make the resistance value of the wiring 84 large, ink droplets are ejected so as not let them contact each other. Alternatively, if ink droplets overlap each other, the following ink droplet is caused to land after the preceding ink droplet forms a dot. The amount of contact between the ink droplets and the timing of their landing can be controlled with the printing head 48.

In sum, by adjusting at least one of the amount of ink droplets contacting each other on the print medium and the time to be taken for ejected ink droplets to contact each other, the setting unit 32 sets a printing condition that allows the wiring 84 to be printed to have the set resistance value. Specifically, the setting unit 32 adjusts the amount of ink droplets contacting each other and the time to be taken for ink droplets to contact each other based on the tone (density) of the print image (print tone). More specifically, the amount of ink applied per unit time is larger when the tone is high than when the tone is low. Accordingly, more ink droplets will be present in proximity to each other on the print medium, thereby increasing the amount of ink droplets contacting each other and shortening the time to be taken for ejected ink droplets to contact each other. Thus, the higher the tone value, the more metal particles will remain on the print medium and the higher the electrical conductivity of the print object will be, that is, the lower the resistance value of the print object will be.

Note that the print image obtained by the obtaining unit 30 is an image using bitmap or vector data. For this reason, the generation unit 34 can increase or decrease the number of dots at each spot in the print image in accordance with the signals of the color and tone at the spot, as in typical image processing. Note that each spot in the print image refers to a unit area in the print image and, for example, corresponds to a pixel in a bitmap image. In the following description the print image will be assumed as a bitmap image.

Figure 7:
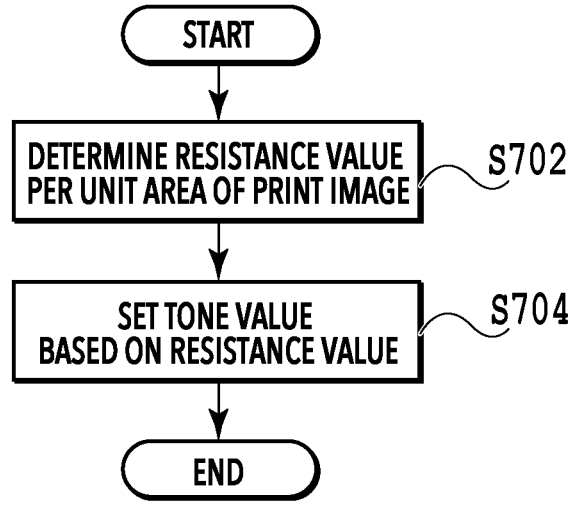
FIG. 7 is a flowchart illustrating a processing routine of a first printing condition setting process.

Now, a first printing condition setting process executed by the setting unit 32 will be described with reference to FIG. 7. FIG. 7 illustrates a flowchart illustrating a specific processing routine of the first printing condition setting process. In this first printing condition setting process, first, the resistance value to be obtained at each pixel of the print image obtained by the obtaining unit 30 is determined (S702). Specifically, in S702, the resistance value at each pixel of the print image is determined based on the resistance value of the wiring 84. More specifically, as described later, it is determined by calculating the resistance value per unit area of the wiring 84.

Figure 8:
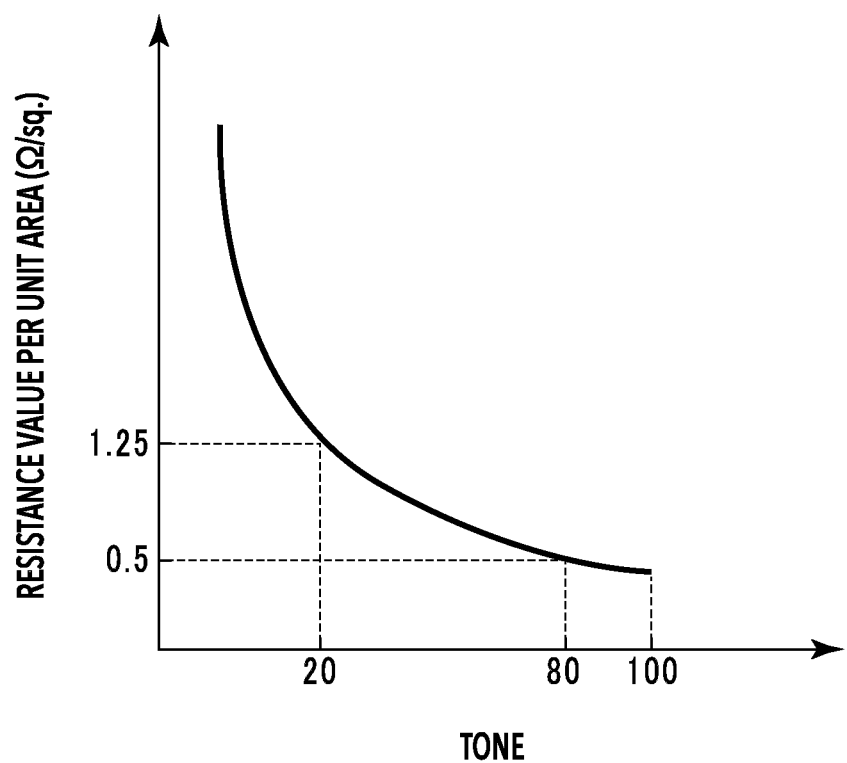
FIG. 8 is a graph illustrating the relationship between resistance values per unit area of a print object and tones.

Then, the tone value at each pixel of the print image is set based on the determined resistance value (S704), and the first printing condition setting process is then terminated. Specifically, in S704, the tone value is set as the printing condition based on a graph indicating the relationship between tone values and resistance values per unit area. As illustrated in FIG. 8, the horizontal axis of this graph indicates tone values. These tone values are defined as tone values per pixel in the print image ranging from a value of 1 to a value of 100 with no unit. A tone "1" refers to the minimum amount of ink which the printing apparatus 40 can record and the print object can exhibit electrical conductivity. A tone "100" refers to the maximum amount of ink which the printing apparatus 40 can print. The vertical axis indicates resistance values exhibited by applying amounts of ink corresponding to the tone "1" to the tone "100" and presented as resistance values per unit area ($\Omega$/sq.).

For an electric circuit in which a 6-V battery 82 and a 3.5-V 20-mA LED lamp 78 (white) are connected by the wiring 84 illustrated in FIG. 4, the total resistance value of the wiring 84 is set to 125$\Omega$, as described above. In this way, the wiring resistance for limiting the current value is appropriate. Hence, the LED lamp 78 can be operated (turned on and off) well without any resistive element provided in the electric circuit. For example, assume that the wiring 84 is formed to have a wiring width of 1 mm and a total length of 100 mm. Specifically, assume that, the wiring 84 is formed of three wirings 84-1, 84-2, and 84-3, as illustrated in FIG. 4, the sum of the lengths of these three wirings is 100 mm, and each wiring is formed to have a width of 1 mm. In this case, the resistance value per unit area is 1.25 $\Omega$/sq. according to equation (2) below (corresponding to the process of S702).

$$R = Rs \cdot L/W \quad (2)$$

R: resistance value
Rs: sheet resistance (resistance value per unit area)
L: wiring length
W: wiring width Then, according to the graph of FIG. 8, the tone that allows a resistance value of 1.25 $\Omega$/sq. per unit area to be exhibited is "20." Consequently, a tone value "20" is obtained for the wiring 84 (including the terminals) in the print image. The "tone value 20" thus obtained is set as the printing condition (corresponding to the process of S704).

For an electric circuit in which a 3-V battery 82 and a 2-V 20-mA LED lamp 78 (red) are connected by the wiring 84 illustrated in FIG. 4, the total resistance value of the wiring 84 is set to 50$\Omega$. Thus, if the wiring 84 is formed to have a wiring width of 1 mm and a total length of 100 mm, the resistance value per unit area is 0.5$\Omega$ according to equation (2) (corresponding to the process of S702). Then, according to the graph of FIG. 8, the tone that allows a resistance value of 0.5 $\Omega$/sq. per unit area to be exhibited is "80." Consequently, a tone value "80" is obtained for the wiring 84 (including the terminals) in the print image. The "tone value 80" thus obtained is set as the printing condition (corresponding to the process of S704).

The graph illustrated in FIG. 8, indicating the relationship between tone values and resistance values, is held in the form of a lookup table in the setting unit 32. Note that, in one example, for S704, some discrete values indicating the relationship between tone values and resistance values per unit area may be held in advance, and the tone value may be obtained by interpolating these values. Alternatively, a relational expression for tone values and resistance values per unit area may be held, and the tone value may be obtained by using this relational expression. Also, the tone value may be expressed in 8-bit format to further improve the accuracy. With 8-bit format, the number of gradations is 256. Further, for improvement in wiring formation and the like, a gradation conversion step using a one-dimensional lookup table or the like many be added. Conversely, for simplification of the processing program, the tone gradation value range may be narrowed.

The size of each pixel (unit area) in the print image, for which a tone value is set, is determined as appropriate. For example, the pixel size is determined by the density of printing elements (nozzles) in the printing apparatus 40, the units of control of a scan mechanism for the carriage 60 and a print medium conveying mechanism, the time required for data processing, and so on. Note that the pixel size is determined to achieve processing with a sufficiently high resolution for the wiring 84 in the circuit. For example, in a case where the resolution is controlled to be 600 dpi, the pixel size is approximately 42 μm, which is sufficiently smaller than the width of a normally formed wiring. Then, even if the tone of the wiring 84 is changed, only the dot pattern in the region of the wiring 84 in the print image is changed. Hence, the outer shape of the wiring 84 will not be changed, that is, the wiring 84 will not be widened or narrowed.

Also, the setting unit 32 changes the tone to adjust the resistance value of the print object to be printed by the printing apparatus 40. Thus, in the printing of the print object based on the image data generated by the image generation apparatus 10, the amount of ink used by the printing apparatus 40 increases the higher the tone.

Based on the print image and the printing condition, the generation unit 34 generates print data for print the print image on a print medium with the printing apparatus 40. Specifically, the printing apparatus 40 forms an image based on and off of dots at predetermined intervals. Thus, the generation unit 34 converts the many tone values into on-off patterns of dots. A quantization method such as a publicly known error diffusion or dithering method is used as the conversion method. As a result, the converted dot patterns, corresponding to the tone values set as the printing condition, are obtained. Meanwhile, as for the dot pattern conversion method, dot patterns set for respective tones may be used. Consequently, the generation unit 34 generates image data to be printed by the printing apparatus 40 in the form of dot patterns converted for the respective pixels of the print image.

Also, the generation unit 34 generates various parameters necessary for the printing (print setting parameters) and outputs the generated image data and print setting parameters to the printing apparatus 40. Note that the printing apparatus 40 performs the printing on a print medium based on the input image data. In doing so, the printing apparatus 40 prints the wiring 84 (including the terminals) in the image data with the metal particle-containing ink. Specifically, the generation unit 34 generates image data for printing the print image obtained by the obtaining unit 30 under the printing condition set by the setting unit 32 and also generates print data containing the print medium parameters. The print setting parameters are, for example, information indicating the type and size of the print medium and image processing parameters. Note that these print setting parameters are not limited to these as long as they are parameters which can be input into the printing apparatus 40 and with which the printing apparatus 40 can execute the printing based on the image data.

The printing apparatus 40 is a printing apparatus that performs print using the metal particle-containing ink; it prints an electric circuit image on a print medium based on print data output from the image generation apparatus 10. Consequently, an electric circuit is formed on the print medium with the metal particle-containing ink. Specifically, the entire operation of the printing apparatus 40 is controlled by a control unit 42 configured of a CPU (not illustrated) and so on. A printing buffer 46, a printing head 48, a motor control unit 50, an I/F 52, and a data buffer 53 are connected to this control unit 42 through a bus 44. The printing buffer 46 stores image data in the form of raster data before it is forwarded to the printing head 48. The printing head 48 includes a plurality of nozzles (recording elements) capable of ejecting ink droplets by an inkjet method and ejects the ink from each nozzle based on the print data. The motor control unit 50 performs control to move a motor for conveying a print medium and to move the carriage 60 (described later). The I/F 52 is connected to the image generation apparatus 10 and transmits and receives various pieces of information to and from the image generation apparatus 10. The data buffer 53 temporarily stores various pieces of data output from the image generation apparatus 10.

Figure 9:
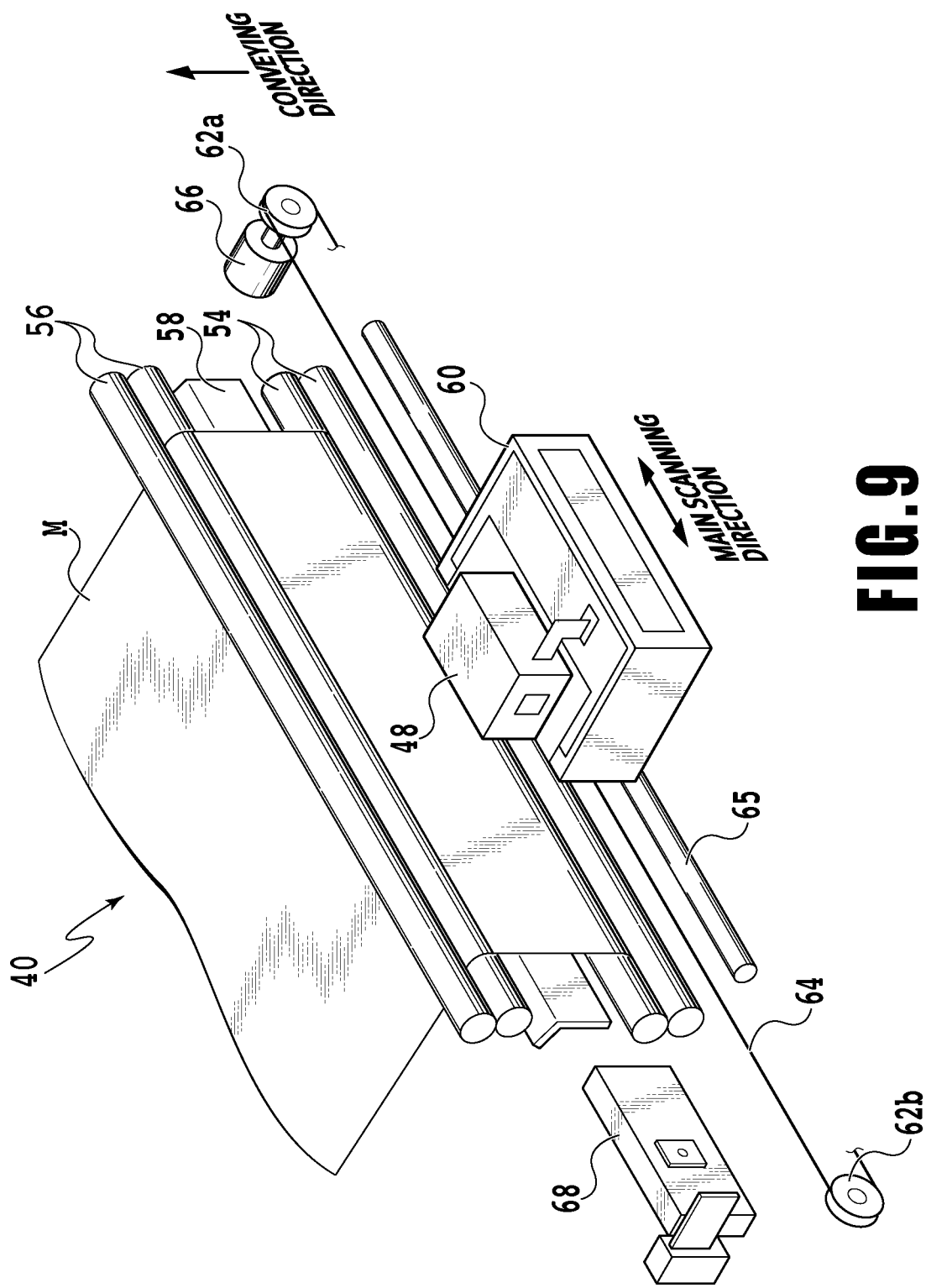
FIG. 9 is a schematic configuration diagram of a printing apparatus.

Specifically, as illustrated in FIG. 9, the print apparatus 40 is a so-called serial scan-type print apparatus, in which a print head ejects ink onto a print medium conveyed in a predetermined direction while moving in a direction crossing the conveying direction (in this embodiment, perpendicularly crossing the conveying direction). More specifically, the printing apparatus 40 includes conveying roller pairs 54 and 56 that nip and convey a print medium M fed from a cassette or the like by a feeding roller (not illustrated). The conveying roller pairs 54 and 56 are disposed with a predetermined gap left therebetween, and a platen 58 that supports the conveyed print medium M is disposed between the conveying roller pair 54 and the conveying roller pair 56. Also, in the printing apparatus 40, the printing head 48 is disposed such that its ejection surface, in which the ink ejection nozzles are provided, faces the platen 58. An ink tank (not illustrated) is connected to the printing head 48, and an ink fed from the ink tank is ejected through the nozzles. Note that the ink stored in this ink tank is the metal particle-containing ink.

The printing apparatus 40 includes the carriage 60, which moves the printing head 48 loaded thereon in the main scanning direction, crossing the conveying direction (in this embodiment, perpendicularly crossing the conveying direction). An endless belt 64 laid in a tensioned state on pulleys 62a and 62b is connected to this carriage 60, and the pulley 62a is provided on the rotation shaft of a motor 66. Also, the carriage 60 is provided so as to be movable along a guide shaft 65 extending in the main scanning direction. Thus, the carriage 60 moves forward and backward in the main scanning direction along the guide shaft 65 by means of the belt 64 by using drive of the motor 66. The printing apparatus 40 also includes a recovery unit 68 that maintains and recovers the condition of ink ejection from the nozzles with a predetermined timing.

In the printing apparatus 40, printing is performed by causing the printing head 48 to eject the metal particle-containing ink based on the print data while moving the printing head 48 in the main scanning direction with the carriage 60. Then, the print medium M is conveyed in the conveying direction by a predetermined amount by the conveying roller pairs 54 and 56, and thereafter printing is performed again with the printing head 48 moved in the main scanning direction. The image based on the print data is printed on the print medium M by repeating this operation.

Note that the above description assumes a printing apparatus that performs printing on a print medium M that is a print medium in a thin sheet shape such as a print paper sheet or a plastic sheet. However, a printing apparatus that performs printing on a print medium such as glass, a plastic plate, or a thick paper sheet may be used instead. In this case, the printing apparatus is provided with a stage on which to place the print medium and configured to convey the print medium along with the stage. Note that the print medium may just need to be not electrically conductive and be capable of receiving ink, and may just be such a print medium that an image formed thereon with a metal particle-containing ink exhibits electrical conductivity.

The metal particle-containing ink is an ink that contains silver or carbon particles and so on and, when ejected onto a print medium from the printing apparatus 40, forms a metal film on the print medium and exhibits electrical conductivity. Specifically, a metallic ink, for example, is used as the metal particle-containing ink, and this metallic ink contains metal particles. The content (% by mass) of the metal particles in the ink is preferably not smaller than 0.1% by mass and not larger than 30.0% by mass of the entire mass of the ink and more preferably not smaller than 1.0% by mass and not larger than 15.0% by mass of the entire mass of the ink.

The metal particles are not particularly limited but may be particles of, for example, gold, silver, copper, platinum, aluminum, titanium, chromium, iron, nickel, zinc, zirconium, or tin. These metal particles may be a single metal or an alloy. Alternatively, the metal particles may use a combination of these. Meanwhile, it is preferable to use gold, silver, or copper particles as the metal particles in view of the preservation stability of the metal particles and the electrical conductivity and glossiness of formed images (metal films). In particular, silver particles can express a wide range of metallic colors by being combined with a chromatic ink since the formed image has high glossiness and is achromatic. The average particle size of silver particles is preferably not smaller than 1 nm and not larger than 200 nm and more preferably not smaller than 10 nm and not larger than 100 nm in view of the preservation stability of the ink and the glossiness of images formed with the silver particles.

Also, the metallic ink may contain water (ion-exchange water) as well as various additives. Examples of the additives include a dispersant such as a dispersion resin or a surfactant, a surfactant for adjusting the ink surface tension, a water-soluble organic solvent, a pH adjuster, a corrosion inhibitor, a preservative, a mildewproofing agent, an antioxidant, a reduction inhibitor, an evaporation accelerator, and so on. In this way, the ink can exhibit electrical conductivity and glossiness by being applied onto a print medium without a special operation such as sintering.

A case of forming an electric circuit on a print medium by using the image formation apparatus 200 with the above configuration will be described. In a case where a general-purpose personal computer or the like is used as the image generation apparatus 10, an application for executing the functions of the image generation apparatus 10 is installed in the personal computer or the like in advance.

First, the image generation apparatus 10 generates print data for forming an electric circuit on a print medium with the printing apparatus 40 (i.e. print data for printing an electric circuit image). The image generation apparatus 10 starts a first generation process of generating the print data when the user selects the "print" button 74-4 in the operation display portion 74, thereby giving an instruction to print the electric circuit image. Note that, in one example, for the first generation process, an instruction to generate only the print data may be input and, after the print data is generated, the print data may be output to the printing apparatus 40 with any timing and the electric circuit image may be printed by the printing apparatus 40. Specifically, in this case, the first generation process is a process up to the generation of the print data.

Figure 10:
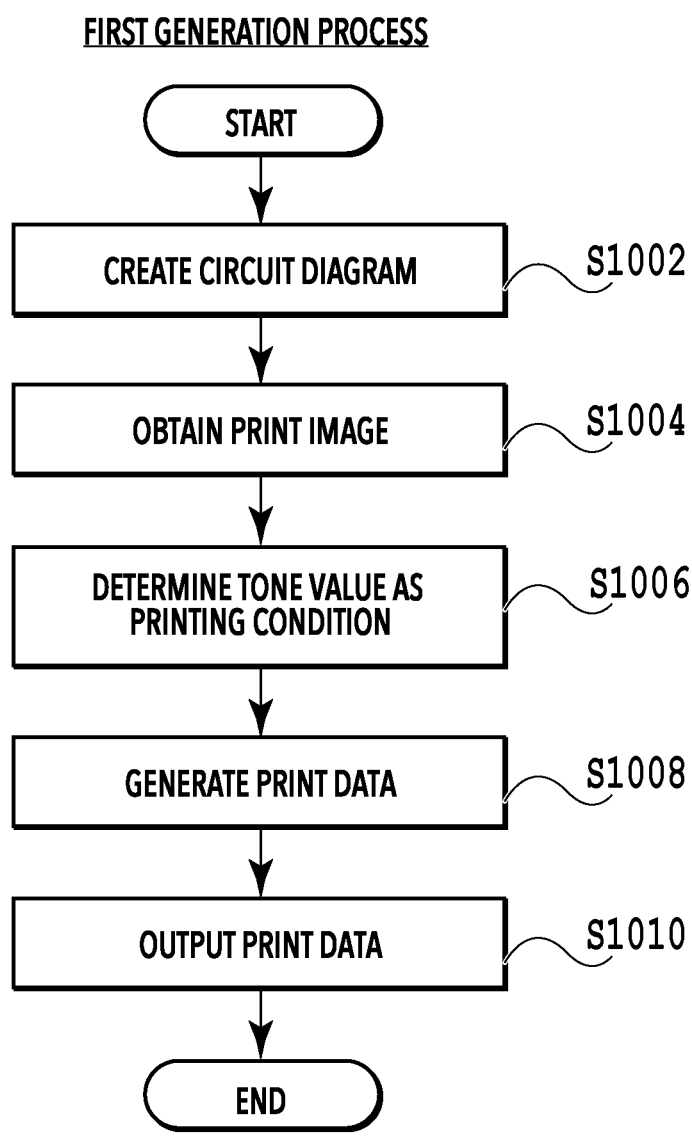
FIG. 10 is a flowchart illustrating a processing routine of a first generation process.

Here, a flowchart in FIG. 10 illustrates a processing routine of the first generation process, performed by this image generation apparatus 10 to generate the print data for printing the electric circuit image on a print medium. In this first generation process, first, a circuit diagram is created based on inputs from the user (S1002). Specifically, in S1002, the creation unit 28 displays the circuit diagram creation screen 70 on the display unit 18 and creates a circuit diagram based on information which the user inputs by operating the circuit diagram creation screen 70.

Then, a print image as the electric circuit image to be printed on a print medium is obtained based on size information input by the user and the created circuit diagram (S1004). Specifically, in S1004, the obtaining unit 30 obtains the electric circuit image to be printed on a print medium based on the circuit diagram created in S1002 and the size information input by the user. Meanwhile, in one example, an input section in which to input the size information is displayed on the circuit diagram creation screen 70, and the user inputs the size information into it such that the image will be a printable size on a print medium. Also, in the print image obtained in this step, a terminal is provided at each end of the wiring 84.

Then, the tone value as the printing condition for printing the electric circuit image is set based on the resistance value of the wiring 84 (S1006). Specifically, in S1006, the first printing condition setting process is performed, in which the setting unit 32 obtains the tone value at each pixel of the print image based on the resistance value of the wiring 84 input (calculated) during the creation of the circuit diagram. Then, the tone value thus obtained is set as the printing condition.

Then, print data for printing the electric circuit image with the printing apparatus 40 is generated based on the print image and the printing condition (S1008), and the generated print data is output to the printing apparatus 40 (S1010). The first generation process is then terminated. Specifically, in S1008, the generation unit 34 converts each pixel of the print image into a dot pattern corresponding to the tone value, or the printing condition, and generates image data for printing the print image with the converted dot patterns. The generation unit 34 also generates print setting parameters based on input information, previously stored information, and so on.

Then, after the print data is output to the printing apparatus 40, the printing apparatus 40 prints the electric circuit image on a print medium based on the print data. As a result, an electric circuit is formed on the print medium. Designated parts will be connected to the terminal portions of the formed electric circuit based on the created circuit diagram. Specifically, an LED lamp unit will be disposed between the wiring 84-1 and the wiring 84-2. Further, a battery will be disposed between the wiring 84-2 and the wiring 84-3. Furthermore, a switch unit will be disposed between the wiring 84-1 and the wiring 84-3. In one example, electrically conductive tape or the like is used to connect each part and the corresponding terminals.

As described above, the image generation apparatus 10 sets the tone values as the printing condition based on the print image, obtained based on the created circuit diagram, and the resistance value of the wiring 84, input (calculated) during the creation of the circuit diagram. Then, the image generation apparatus 10 generates image data with dot patterns based on the tone values.

In this way, the image generation apparatus 10 can generate print data for forming an electric circuit with the printing apparatus 40 based on simple inputs from the user. Hence, an electric circuit can be easily formed using a metal particle-containing ink. Also, in the formed electric circuit, the wiring resistance of the wiring 84, made of the metal particle-containing ink, provides resistance that allows its parts to operate properly. Hence, no resistive element or the like needs to be provided. Accordingly, with the formed electric circuit, the number of components is fewer, thereby making it possible to reduce the manufacturing cost. Also, even when the resistance value must be changed as a result of providing a plurality of LED lamps or providing LED lamps of different colors, the resistance value can be changed only by adjusting the tone of the metal particle-containing ink during the printing.

Incidentally, as for the metal particle-containing ink, the sheet resistance Rs can be changed by means of the type of metal, the processing method, or the manufacturing method. Thus, the resistance value of the print object can be changed by means of the type of metal particle-containing ink (see equation (2)). In this case, however, a plurality of types of metal particle-containing inks differing in sheet resistance must be ejected from the printing head 48. This increases the size of the printing apparatus 40. Also, a plurality of metal particle-containing inks must be prepared. This causes increase in cost. The image generation apparatus 10 adjusts the resistance value by means of the tone of a metal particle-containing ink to be ejected. Hence, the printing apparatus 40 can form print objects with various resistance values by using a single type of metal particle-containing ink. This makes it possible to suppress increase in size of the printing apparatus 40 and increase in cost.

Also, according to equation (2), the resistance value of the wiring 84 can be changed by changing the length and/or the width of the print object (wiring 84). However, adjusting the resistance value by means of the length and/or the width of the wiring 84 imposes constraints on the user's circuit design and reduces the degree of freedom in design of the circuit diagram. Note that the circuit design includes determination of the choice and layout of the parts to be used, the method of wiring the parts to each other, the area of the entire circuit, and so on. In the image generation apparatus 10, neither the length nor the width of the wiring 84 is changed. Thus, the above problem will not occur. Accordingly, the degree of freedom in design will not be reduced.

The above-mentioned constraints on the circuit design include, for example, constraints originating from a heat circuit's heat generation and power consumption characteristics. If a heater circuit's resistance value is too small, the amount of heat generation will be so small that sufficient heating will not be achieved, whereas if the heater circuit's resistance value is too large, the power consumption will be unnecessarily large. For this reason, when a heater circuit is formed, its resistance value needs to be within an appropriate range. According to this embodiment, even in such a case, the resistance value can be within an appropriate range without changing the length or the width of the wiring.

Second Embodiment

Next, a second embodiment of the image generation apparatus according to the present invention will be described with reference to FIG. 11A to FIG. 14. Note that in the following description, as with the image generation apparatus 10, the image generation apparatus according to the second embodiment will be described by taking an image formation apparatus as an example. Thus, specific description of components identical or equivalent to those of the above-described image formation apparatus 200 will be omitted as appropriate by using identical reference numerals.

An image generation apparatus 90 (image processing apparatus) according to this second embodiment is connected to a printing apparatus 40 to configure an image formation apparatus 210 that forms an electric circuit on a print medium with the printing apparatus 40. Moreover, this image generation apparatus 90 differs from the above-described image generation apparatus 10 as follows. Specifically, a setting unit 92 provided in a control unit 12 sets the number of passes in multi-pass printing as the printing condition. Also, a generation unit 94 generates print data for performing multi-pass printing using the number of passes set by the setting unit 92.

More specifically, the setting unit 92 sets the number of times a printing head 48 (carriage 60) is scanned (the number of passes) for printing of a unit print area in multi-pass printing, as the printing condition for exhibiting the set resistance value. Multi-pass printing is a printing method in which printing of a unit print area is performed by scanning a printing head a plurality of times. In this embodiment, however, the multi-pass printing also includes performing printing of a unit print area by scanning the printing head once.

Figure 11A:
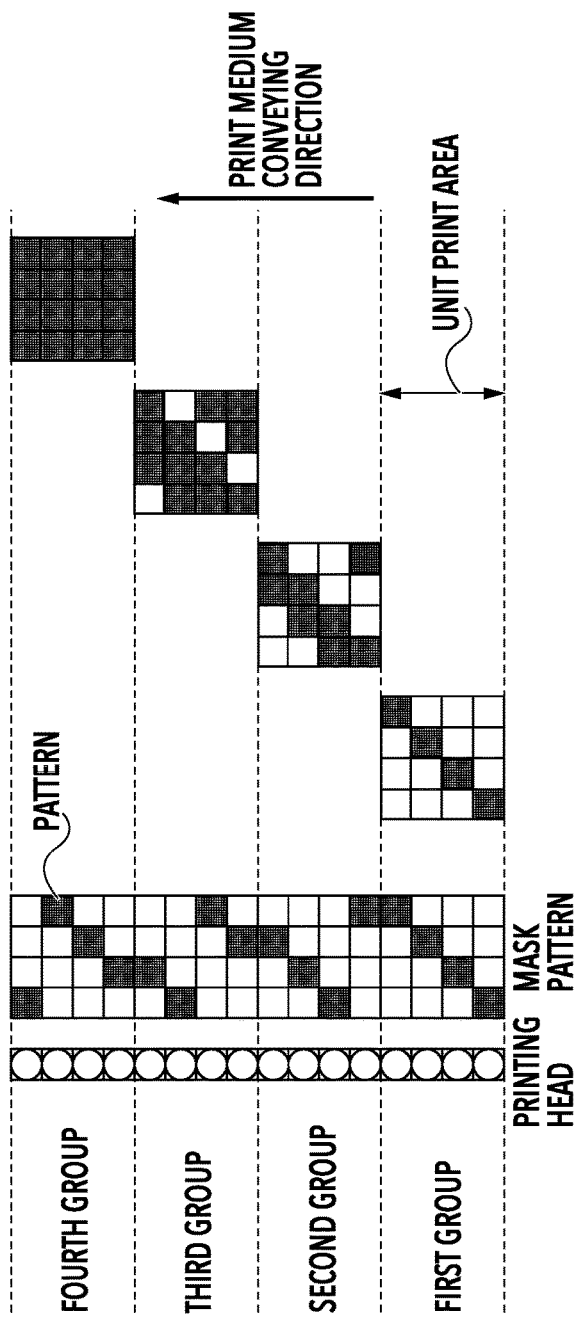
FIG. 11A and FIG. 11B are explanatory diagrams illustrating a difference in the amount of ink ejected in a single pass in multi-pass printing.
Figure 11B:
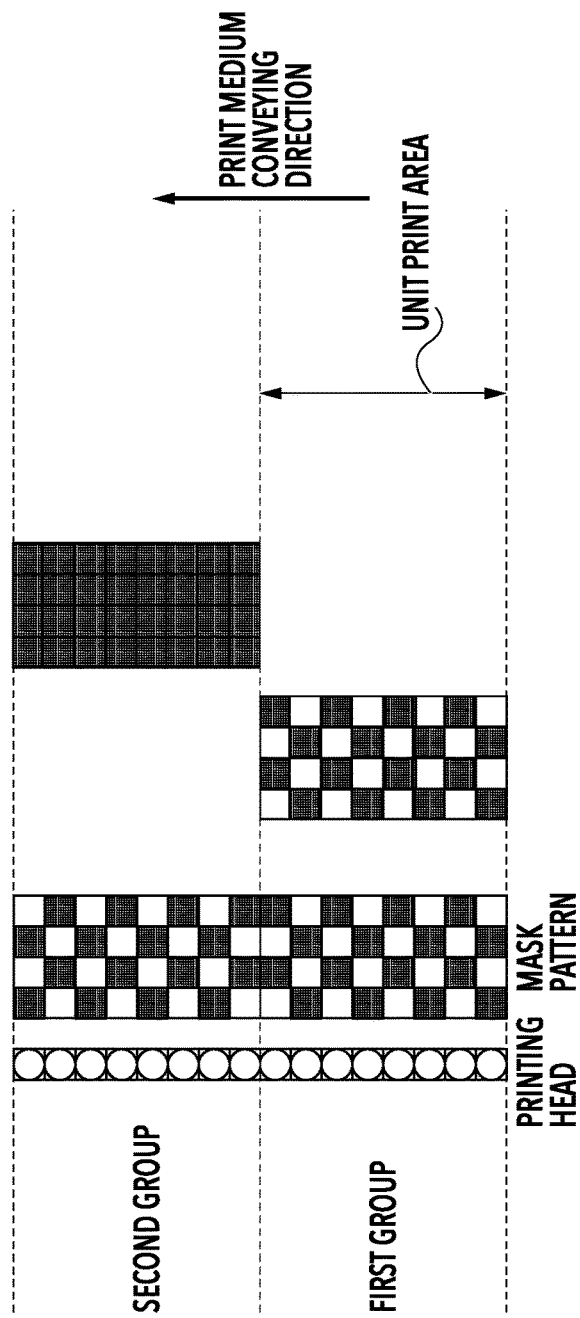
Figure 12:
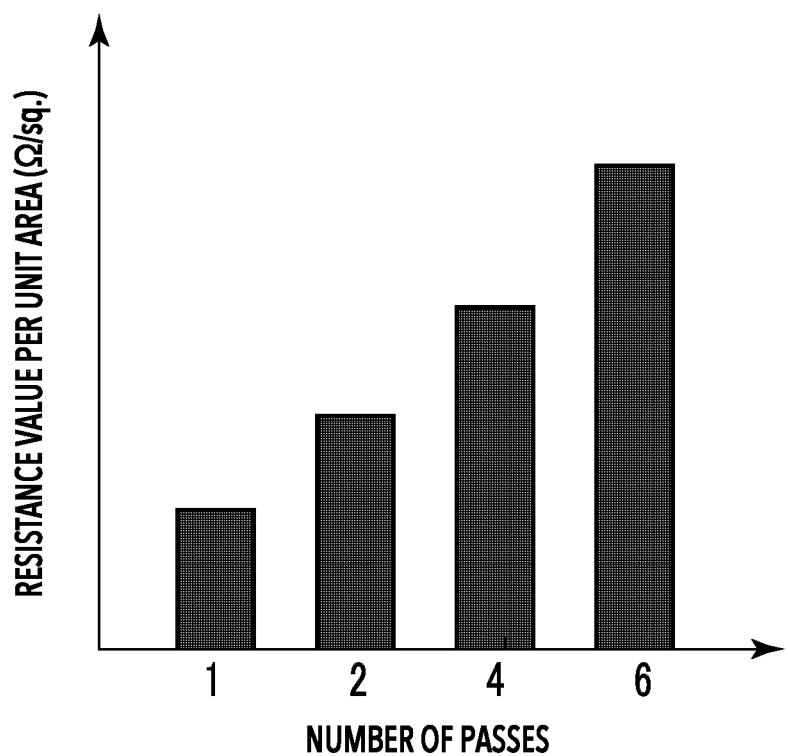
FIG. 12 is an explanatory diagram illustrating resistance values per unit area of a print object based on numbers of passes.

Specifically, the setting unit 92 adjusts the amount of ink droplets contacting each other and the time to be taken for ink droplets to contact each other, based on the number of passes in the multi-pass printing. Here, in a case of performing printing of a unit print area with, for example, four passes, ink is ejected to at most four spots from each of four divided groups of nozzles in a single pass, as illustrated in FIG. 11A. In contrast, in a case of performing printing of a unit print area with two passes, ink is ejected to at most eight spots from each of two divided groups of nozzles in a single pass, as illustrated in FIG. 11B. Thus, if the same print image is to be printed by applying the same amount of ink, the amount of ink to be applied per unit time, i.e. the amount of ink to be applied in a single pass will be larger when the number of passes is small than when the number of passes is large. Thus, when the number of passes is smaller, more ink droplets will be present in proximity to each other on the print medium in a single pass in the printing. Accordingly, the amount of ink droplets contacting each other will be larger and the time taken for ejected ink droplets to contact each other will be shorter as well. Hence, as illustrated in FIG. 12, the smaller the number of passes, the more metal particles will remain on the print medium and the higher the electrical conductivity of the print object will be, that is, the lower the resistance value of the print object will be.

Figure 13:
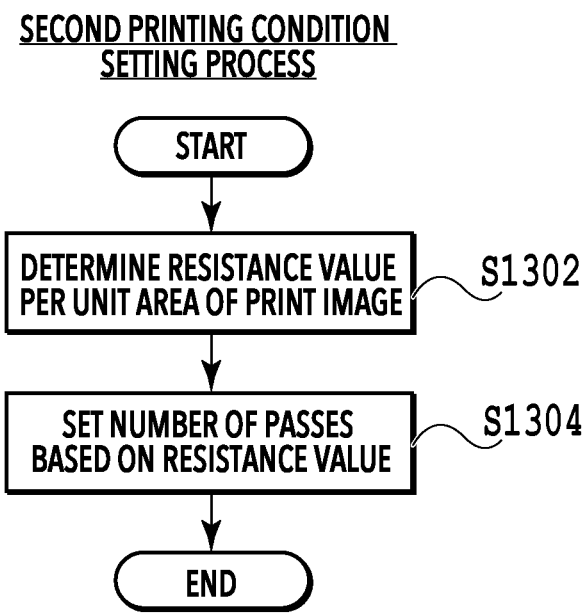
FIG. 13 is a flowchart illustrating a processing routine of a second printing condition setting process.

Now, a second printing condition setting process executed by the setting unit 92 will be described with reference to FIG. 13. FIG. 13 illustrates a flowchart illustrating a specific processing routine of the second printing condition setting process. First, the resistance value to be realized at each pixel of a print image obtained by an obtaining unit 30 is determined (S1302). Details of the content of the process in S1302 are similar to S702 and specific description thereof will therefore be omitted. Then, the number of passes in the multi-pass printing is set based on the determined resistance value (S1304), and the second printing condition setting process is then terminated. Specifically, in S1304, settable resistance values (resistance values per unit area) are sorted into a plurality of levels, and the number of passes corresponding to the level to which the resistance value determined in S1302 belongs is set to be the number of passes as the printing condition. For example, the number of passes is obtained based on a graph in which, as illustrated in FIG. 12, settable resistance values are sorted into four levels and associated with numbers of passes 1, 2, 4, and 6 respectively in ascending order of resistance value from the lowest level to the highest level.

As described above, the setting unit 92 adjusts the resistance value of the print object to be printed by the printing apparatus 40 by changing the number of passes. Thus, in the case of performing printing based on the image data generated by the image generation apparatus 90, the amount of ink used by the printing apparatus 40 remains constant regardless of the number of passes.

The generation unit 94 generates print data for printing the print image on a print medium with the printing apparatus 40 based on the print image and the printing condition. Specifically, the generation unit 94 converts each pixel of the print image into an on-off pattern of dots. As with the generation unit 34, a quantization method such as a publicly known error diffusion or dithering method or a dot pattern conversion method is used as the conversion method. Thereafter, for the print image, image data is generated which is obtained by thinning the image by the unit print area by using a mask pattern. Specifically, image data for printing the print image by multi-pass printing in which printing of a unit print area is performed using the set number of passes, is generated. Unique mask patterns are stored as many as the number of passes, and the print image is thinned while the mask pattern to be used is changed according to the number of passes, which is the printing condition. Note that each mask pattern is formed to substantially evenly thin the image. Also, the generation unit 94 outputs print setting parameters to the printing apparatus 40 along with the generated image data. These print setting parameters include information on the multi-pass printing (e.g. information on the amount of sheet feed corresponding to the set number of passes) in addition to the type and size of the print medium, image processing parameters, and so on.

A case of forming an electric circuit on a print medium by using the image formation apparatus 210 with the above configuration will be described. In a case where a general-purpose personal computer or the like is used as the image generation apparatus 90, an application for executing the functions of the image generation apparatus 90 is installed in the personal computer.

First, the image generation apparatus 90 generates print data for forming an electric circuit on a print medium with the printing apparatus 40 (print data for printing an electric circuit image). The image generation apparatus 90 starts a second generation process of generating the print data when the user selects a "print" button 74-4, thereby giving an instruction to print the electric circuit image. As in the first generation process, the second generation process may be a process up to the generation of the print data.

Figure 14:
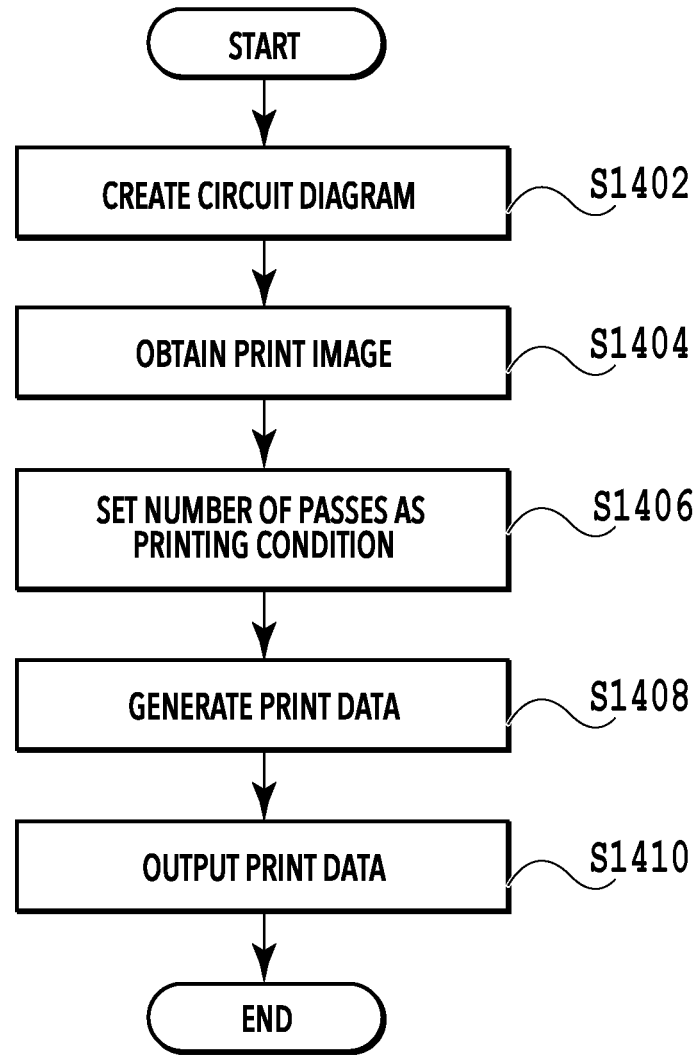
FIG. 14 is a flowchart illustrating a processing routine of a second generation process.

Here, a flowchart in FIG. 14 illustrates a processing routine of the second generation process, performed by this image generation apparatus 90 to generate the print data for printing the electric circuit image on a print medium. In this second generation process, first, a circuit diagram is created based on inputs from the user (S1402). Then, a print image as the electric circuit image to be printed on a print medium is obtained based on size information input by the user and the created circuit diagram (S1404). Details of the contents of the processes in S1402 and S1404 are similar to S1002 and S1004, respectively, and specific description thereof will therefore be omitted.

Then, the number of passes as the printing condition for printing the electric circuit image is set based on the resistance value of the wiring 84 (S1406). Specifically, in S1406, the second printing condition setting process is performed, in which the setting unit 92 sets the number of passes in the multi-pass printing based on the resistance value of the wiring 84 input (calculated) during the creation of the circuit diagram.

Then, print data for printing the electric circuit image with the printing apparatus 40 is generated based on the print image and the printing condition (S1408), and the generated print data is output to the printing apparatus 40 (S1410). The second generation process is then terminated. Specifically, in S1408, the generation unit 94 converts each pixel of the print image into an on-off pattern of dots and then, for the print image, generates image data obtained by thinning the image by the unit print area by using mask patterns. In other words, the generation unit 94 generates image data for printing the print image by multi-pass printing in which printing of a unit print area is performed using the set number of passes. The generation unit 94 also generates print setting parameters based on input information, previously stored information, and so on.

Then, after the print data is output to the printing apparatus 40, the printing apparatus 40 forms the electric circuit image on a print medium based on the print data. As a result, an electric circuit is formed on the print medium. Designated parts will be connected to the terminal portions of the formed electric circuit based on the created circuit diagram.

As described above, the image generation apparatus 90 sets the number of passes in multi-pass printing as the printing condition based on the print image, obtained based on the created circuit diagram, and the resistance value of the wiring 84, input (calculated) during the creation of the circuit diagram. Then, the image generation apparatus 90 generates print data for printing the print image by using the set number of passes.

In this way, it is possible to achieve advantageous effects similar to those by the above-described image generation apparatus 10. Moreover, image data generated by the image generation apparatus 90 uses the same amount of metal particle-containing ink for an electric circuit with a large resistance value and an electric circuit with a small resistance value. It is easier to manage the metal particle-containing ink with the image generation apparatus 90 than with the image generation apparatus 10, which uses different amounts of metal particle-containing ink for an electric circuit with a large resistance value and an electric circuit with a large resistance value.

Third Embodiment

Next, a third embodiment of the image generation apparatus according to the present invention will be described with reference to FIG. 15A to FIG. 17. Note that in the following description, as with the image generation apparatus 10, the image generation apparatus according to the third embodiment will be described by taking an image formation apparatus as an example. Thus, specific description of components identical or equivalent to those of the above-described image formation apparatus 200 will be omitted as appropriate by using identical reference numerals.

The above-described image generation apparatus 90 adjusts the resistance value of an electric circuit (wiring 84) by adjusting the number of passes. However, an image generation apparatus 100 (image processing apparatus) according to the third embodiment adjusts the resistance value of an electric circuit by adjusting print density in multi-pass printing. This image generation apparatus 100 is connected to a printing apparatus 40 to configure an image formation apparatus 220 that forms an electric circuit on a print medium with the printing apparatus 40. Moreover, the image generation apparatus 100 differs from the above-described image generation apparatus 10 as follows. Specifically, a setting unit 102 provided in a control unit 12 sets predetermined mask patterns as the printing condition from among mask patterns differing in print density. Also, a generation unit 104 generates print data for performing multi-pass printing with a predetermined number of passes by thinning the image with the mask patterns set by the setting unit 102.

More specifically, the setting unit 102 sets predetermined mask patterns for multi-pass printing from among a plurality of mask patterns that provide different print densities between passes, as the printing condition for exhibiting the set resistance value. Specifically, the setting unit 102 adjusts the difference in print density between passes to adjust the amount of ink droplets contacting each other and the time to be taken for ink droplets to contact each other.

Here, if the print density is even between passes, there will be no difference in the amount of ink droplets applied in a single pass. However, if the print density is greatly different and uneven between passes, there will be a large difference in the amount of ink droplets applied in a single pass. In other words, if the print density is uneven between passes, the print density will be higher with a given one of the passes and lower with the other pass. Here, the amount of ink applied per unit time is larger when the print density is high than when the record density is low. Thus, more ink droplets will be present in proximity to each other on the print medium when the print density is high than when the print density is low. Accordingly, the amount of ink droplets contacting each other will be larger and the time taken for ejected ink droplets to contact each other will be shorter as well. Thus, the more different and less even are the print densities of passes given by the mask patterns used for multi-pass printing, the more metal particles will remain on the print medium and the higher the electrical conductivity of the print object will be, that is, the lower the resistance value of the print object will be.

Figure 15A:
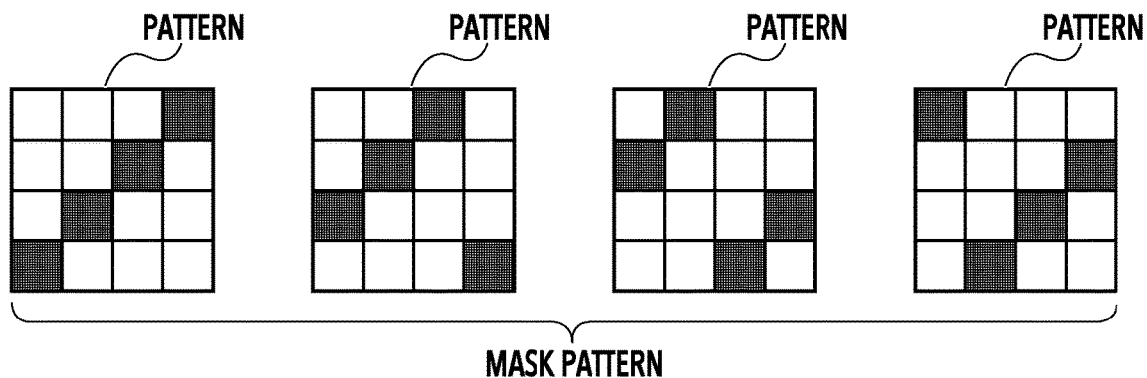
FIG. 15A, FIG. 15B, and FIG. 15C are explanatory diagrams illustrating even mask patterns and uneven mask patterns and an explanatory diagram illustrating the resistance values per unit area of print objects printed using these mask patterns.

For example, assume that printing of a unit print area is performed in four passes and the ink is ejected from four divided groups of nozzles such that the print density will be substantially even between passes. In this case, the four patterns for these nozzle groups are formed to thin the image evenly with respect to each other (see FIG. 15A). In this way, the ink is ejected onto at most four spots in a single pass. Specifically, mask patterns with the four patterns in FIG. 15A are the same as the mask patterns in FIG. 11A, and printing of 25% of a unit print area is performed in a single pass by using each of these mask patterns.

Figure 15B:
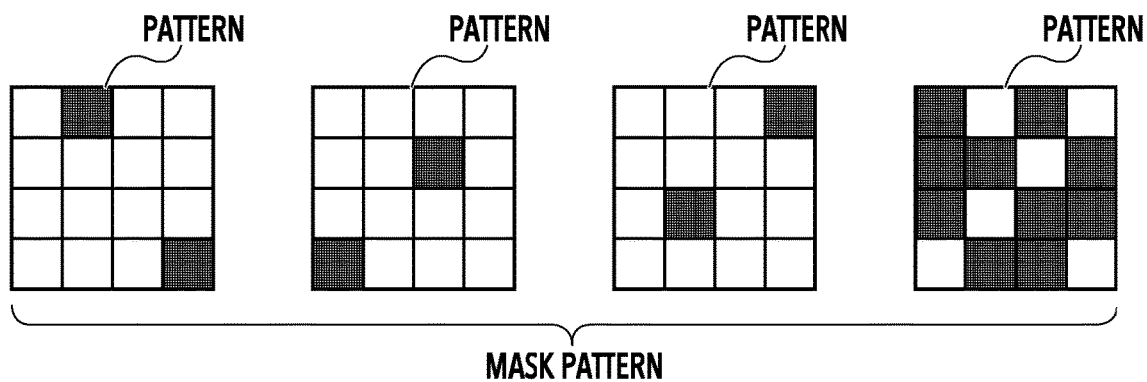
Figure 15C:
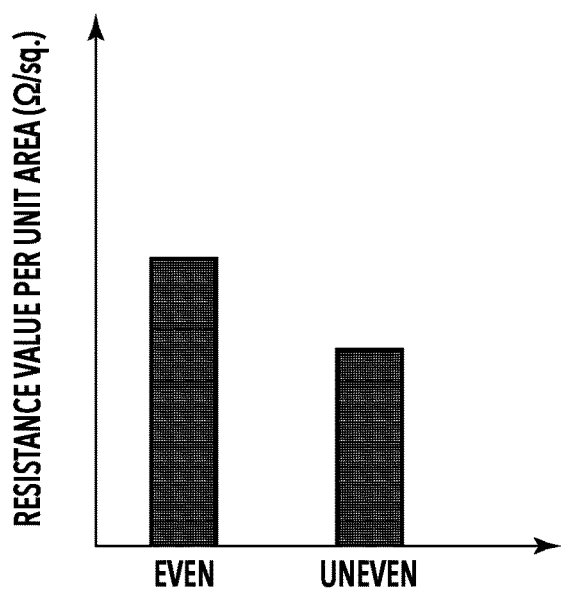

In contrast, in a case where the ink is ejected from the four divided groups of nozzles such that the print density will be greatly different and uneven between passes, the four patterns for these nozzle groups are formed to thin the image unevenly, as illustrated in FIG. 15B. In this way, ink is ejected onto at most 10 spots in a single pass. Specifically, when mask patterns with the patterns in FIG. 15B are used, printing of 12.5% of a print area is performed in each of three passes, and printing of 62.5% is performed in a single pass. In the case where the ink is ejected unevenly as above, the print density is high in at least one of the plurality of passes unlike the case where the ink is ejected evenly. Thus, more ink droplets landing on the print medium will be present in proximity to each other when a mask pattern with a higher print density pattern is set. Accordingly, the number of ink droplets contacting each other will be larger and the time taken for ink droplets to contact each other will be shorter as well. Thus, as illustrated in FIG. 15C, the resistance value (resistance value per unit area) exhibited will be lower when the print density is uneven between passes than when the print density is even between passes.

The setting unit 102 holds a plurality of mask patterns differing in print density for performing printing of a unit print area in a plurality of passes, for example. In one example, the setting unit 102 holds mask patterns differing in print density for performing printing of a unit print area in four passes (see FIG. 15A and FIG. 15B). Note that the held mask patterns are associated with resistance values to be exhibited upon printing (resistance values per unit area) based on the type of metal particle-containing ink to be used and the type of print medium to be used. Then, when setting the printing condition, the setting unit 102 sets the mask patterns based on these resistance values. Here, the print density in a single pass is not limited to the above numerical values. Also, although the print density is high only in one pass and even among the other passes, the present invention is not limited to this. The print density may be different in all passes.

Figure 16:
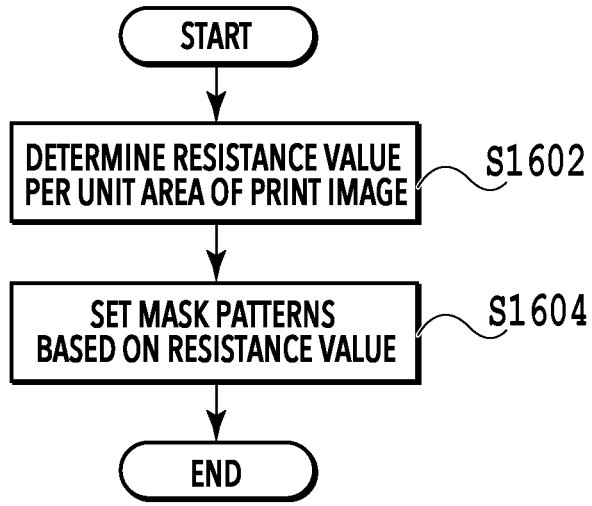
FIG. 16 is a flowchart illustrating a processing routine of a third printing condition setting process.

Now, a third printing condition setting process executed by the setting unit 102 will be described with reference to FIG. 16. FIG. 16 illustrates a flowchart illustrating a specific processing routine of the third printing condition setting process. First, the resistance value to be obtained at each pixel of a print image obtained by an obtaining unit 30 is determined (S1602). Details of the content of the process in S1602 are similar to S702 and specific description thereof will therefore be omitted. Then, the mask patterns are set based on the determined resistance value (S1604), and the third printing condition setting process is then terminated. Specifically, in S1604, the determined resistance value (resistance value per unit area) and the resistance values associated with the held mask patterns are compared with each other, and the mask patterns with which a close resistance value is associated are selected and these mask patterns are set as the printing condition.

As described above, the setting unit 102 adjusts the resistance value of the print object to be printed by the printing apparatus 40 by changing the mask patterns that provide different print densities between passes. Thus, in the case of performing printing based on the image data generated by the image generation apparatus 100, the amount of ink used by the printing apparatus 40 remains constant regardless of the mask patterns.

The generation unit 104 generates print data for printing the print image on a print medium with the printing apparatus 40 based on the print image and the printing condition. Specifically, the generation unit 104 converts each pixel of the print image into an on-off pattern of dots. As with the generation unit 34, a quantization method such as a publicly known error diffusion or dithering method or a dot pattern conversion method is used as the conversion method. Thereafter, for the print image, image data is generated which is obtained by thinning the image by the unit print area by using the set mask patterns. Specifically, image data for printing the print image by multi-pass printing in which printing of a unit print area is performed using a predetermined number of passes, is generated. Also, the generation unit 104 outputs print setting parameters to the printing apparatus 40 along with the generated image data. These print setting parameters include information on the multi-pass printing (e.g. information on the amount of sheet feed corresponding to the number of passes) in addition to the type and size of the print medium, image processing parameters, and so on.

A case of forming an electric circuit on a print medium by using the image formation apparatus 220 with the above configuration will be described. In a case where a general-purpose personal computer or the like is used as the image generation apparatus 100, an application for executing the functions of the image generation apparatus 100 is installed in the personal computer.

First, the image generation apparatus 100 generates print data for forming an electric circuit on a print medium with the printing apparatus 40 (print data for printing an electric circuit image). The image generation apparatus 100 starts a third generation process of generating the print data when the user selects a "print" button 74-4, thereby giving an instruction to print the electric circuit image. As in the first generation process, the third generation process may be a process up to the generation of the print data.

Figure 17:
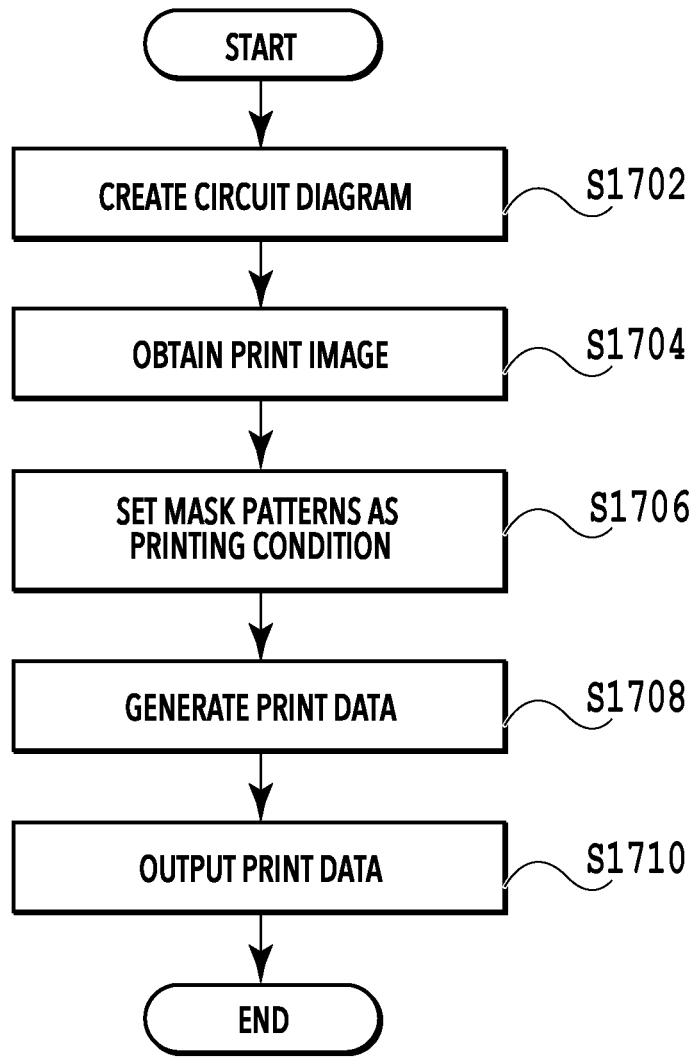
FIG. 17 is a flowchart illustrating a processing routine of a third generation process.

Here, a flowchart in FIG. 17 illustrates a processing routine of the third generation process, performed by this image generation apparatus 100 to generate the print data for printing the electric circuit image on a print medium. In this third generation process, first, a circuit diagram is created based on inputs from the user (S1702). Then, a print image as the electric circuit image to be printed on a print medium is obtained based on size information input by the user and the created circuit diagram (S1704). Details of the contents of the processes in S1702 and S1704 are similar to S1002 and S1004, respectively, and specific description thereof will therefore be omitted.

Then, the mask patterns as the printing condition for printing the electric circuit image are set based on the resistance value of the wiring 84 (S1706). Specifically, in S1706, the third printing condition setting process is performed, in which the setting unit 102 sets the mask patterns based on the resistance value of the wiring 84 input (calculated) during the creation of the circuit diagram.

Then, print data for printing the electric circuit image with the printing apparatus 40 is generated based on the print image and the printing condition (S1708), and the generated print data is output to the printing apparatus 40 (S1710). The third generation process is then terminated. Specifically, in S1708, the generation unit 104 converts each pixel of the print image into an on-off pattern of dots and then, for the print image, generates image data obtained by thinning the image by the unit print area by using the mask patterns. In other words, the generation unit 104 generates image data for printing the print image by multi-pass printing in which printing of a unit print area is performed using a predetermined number of passes. The generation unit 104 also generates print setting parameters based on input information, previously stored information, and so on.

Then, after the print data is output to the printing apparatus 40, the printing apparatus 40 forms the electric circuit image on a print medium based on the print data. As a result, an electric circuit is formed on the print medium. Designated parts will be connected to the terminal portions of the formed electric circuit based on the created circuit diagram.

As described above, the image generation apparatus 100 sets mask patterns as the printing condition based on the print image, obtained based on the created circuit diagram, and the resistance value of the wiring 84, input (calculated) during the creation of the circuit diagram. Then, the image generation apparatus 100 generates print data for printing the print image with a predetermined number of passes by using the set mask patterns. In this way, it is possible to achieve advantageous effects similar to those by the above-described image generation apparatus 90.

Fourth Embodiment

Figure 18:
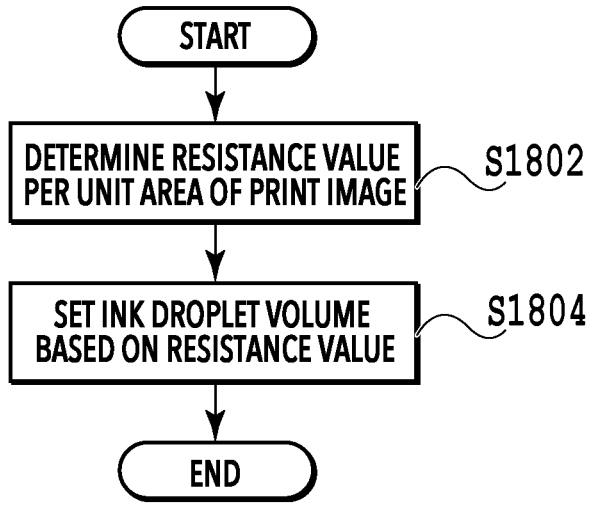
FIG. 18 is a flowchart illustrating a processing routine of a fourth printing condition setting process.

Next, a fourth embodiment of the image generation apparatus according to the present invention will be described with reference to FIG. 18 and FIG. 19. Note that in the following description, as with the image generation apparatus 10, the image generation apparatus according to the fourth embodiment will be described by taking an image formation apparatus as an example. Thus, specific description of components identical or equivalent to those of the above-described image formation apparatus 200 will be omitted as appropriate by using identical reference numerals.

An image generation apparatus 110 (image processing apparatus) according to this fourth embodiment adjusts the resistance value of an electric circuit (wiring 84) by adjusting the volume of ink droplets to be ejected from the nozzles of a printing head 48. The image generation apparatus 110 is connected to a printing apparatus 40 to configure an image formation apparatus 230 that forms an electric circuit on a print medium with the printing apparatus 40. Moreover, the image generation apparatus 110 differs from the above-described image generation apparatus 10 as follows. Specifically, a setting unit 112 provided in a control unit 12 sets the volume of ink droplets to be ejected from the printing head 48 as the printing condition. Also, a generation unit 104 generates print data for performing printing based on the volume of ink droplets set by the setting unit 112.

Note that the printing apparatus 40 is configured to be capable of adjusting the volume of ink droplets to be ejected from the printing head 48. For example, the printing apparatus 40 may include a plurality of printing heads that eject ink droplets with different volumes or be configured to be capable of controlling the volume of ink droplets with a single printing head.

More specifically, the setting unit 112 sets the volume of ink droplets to be ejected from the printing head 48 as the printing condition for exhibiting the set resistance value. Specifically, the setting unit 112 adjusts the amount of ink droplets contacting each other and the time to be taken for ink droplets to contact each other based on the volume of the ink droplets. Here, the amount of ink to be applied per unit time is larger when the volume of ink droplets is large than when the volume is small. In other words, the amount of ink droplets contacting each other is larger when the volume of the ink droplets is large than when the volume of the ink droplets is small. Thus, the larger the ink droplet volume, the more metal particles will remain on the print medium and the higher the electrical conductivity of the print object will be, that is, the lower the resistance value of the print object will be.

The setting unit 112 holds a plurality of pieces of information on different ink droplet volumes. These pieces of information on ink droplet volumes are associated with resistance values to be exhibited upon printing (resistance values per unit area) based on the type of metal particle-containing ink to be used and the type of print medium to be used. Then, when setting the printing condition, the setting unit 112 sets the ink droplet volume based on these resistance values.

Now, a fourth printing condition setting process executed by the setting unit 112 will be described with reference to FIG. 18. FIG. 18 illustrates a flowchart illustrating a specific processing routine of the fourth printing condition setting process. First, the resistance value to be obtained at each pixel of a print image obtained by an obtaining unit 30 is determined (S1802). Details of the content of the process in S1802 are similar to S702 and specific description thereof will therefore be omitted. Then, the ink droplet volume is set based on the determined resistance value (S1804), and the fourth printing condition setting process is then terminated. Specifically, in S1804, the determined resistance value (resistance value per unit area) and the resistance values associated with the held pieces of information on ink droplet volumes are compared with each other, and the piece of information on the ink droplet volume with which a close resistance value is associated is selected. The piece of information on this ink droplet volume is set as the printing condition, so that the ink droplet volume for the printing is set.

As described above, the setting unit 112 adjusts the resistance value of the print object to be printed by the printing apparatus 40 by changing the ink droplet volume. Thus, in the case of performing printing based on the image data generated by the image generation apparatus 110, the amount of ink used by the printing apparatus 40 will vary based on the volume of ink droplets.

The generation unit 114 generates print data for printing the print image on a print medium with the printing apparatus 40 based on the print image and the printing condition. Specifically, the generation unit 114 generates the print data by converting each pixel of the print image into an on-off pattern of dots. As with the generation unit 34, a quantization method such as a publicly known error diffusion or dithering method or a dot pattern conversion method is used as the conversion method. Also, the generation unit 114 generates print setting parameters. These print setting parameters include information on the ink droplet volume set as the printing condition, in addition to the type and size of the print medium, image processing parameters, and so on.

A case of forming an electric circuit on a print medium by using the image formation apparatus 230 with the above configuration will be described. In a case where a general-purpose personal computer or the like is used as the image generation apparatus 110, an application for executing the functions of the image generation apparatus 110 is installed in the personal computer.

First, the image generation apparatus 110 generates print data for forming an electric circuit on a print medium with the printing apparatus 40 (print data for printing an electric circuit image). The image generation apparatus 110 starts a fourth generation process of generating the print data when the user selects a "print" button 74-4, thereby giving an instruction to print the electric circuit image. As in the first generation process, the fourth generation process may be a process up to the generation of the print data.

Figure 19:
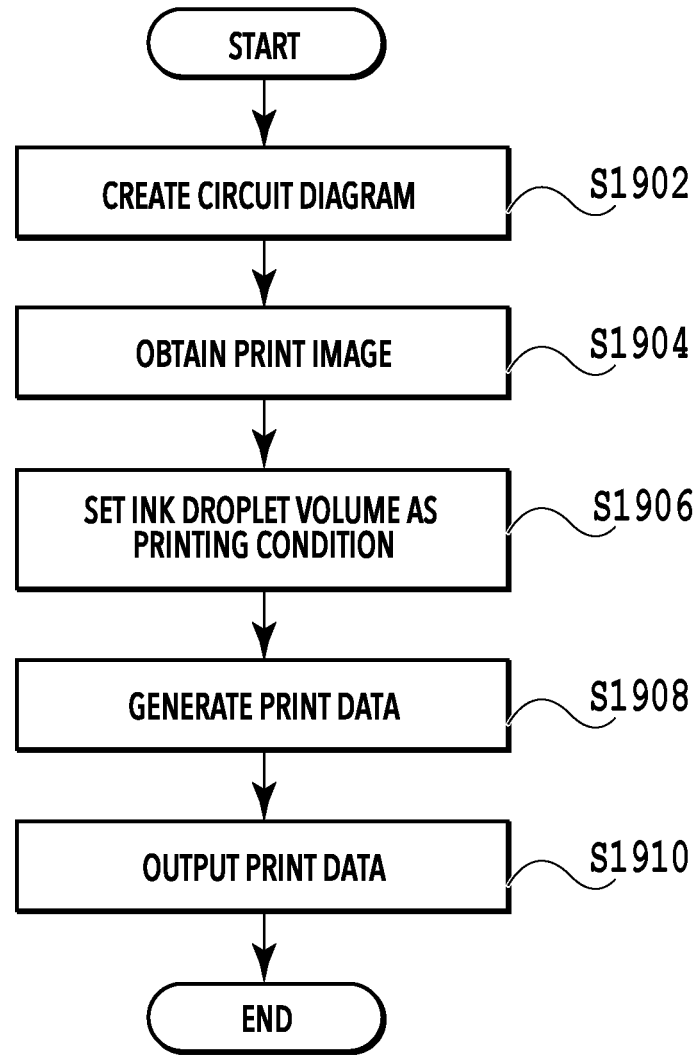
FIG. 19 is a flowchart illustrating a processing routine of a fourth generation process.

Here, a flowchart in FIG. 19 illustrates a processing routine of the fourth generation process, performed by this image generation apparatus 110 to generate the print data for printing the electric circuit image on a print medium. In this fourth generation process, first, a circuit diagram is created based on inputs from the user (S1902). Then, a print image as the electric circuit image to be printed on a print medium is obtained based on size information input by the user and the created circuit diagram (S1904). Details of the contents of the processes in S1902 and S1904 are similar to S1002 and S1004, respectively, and specific description thereof will therefore be omitted.

Then, the ink droplet volume as the printing condition for printing the electric circuit image is set based on the resistance value of the wiring 84 (S1906). Specifically, in S1906, the fourth printing condition setting process is performed, in which the setting unit 112 sets the ink droplet volume based on the resistance value of the wiring 84 input (calculated) during the creation of the circuit diagram.

Then, print data for printing the electric circuit image with the printing apparatus 40 is generated based on the print image and the printing condition (S1908), and the generated print data is output to the printing apparatus 40 (S1910). The fourth generation process is then terminated. Specifically, in S1908, the generation unit 114 converts each pixel of the print image into an on-off pattern of dots and then generates image data for printing the print image with the converted dot patterns. The generation unit 114 also generates print setting parameters including information on the ink droplet volume set as the printing condition.

Then, after the print data is output to the printing apparatus 40, the printing apparatus 40 forms the electric circuit image on a print medium based on the print data. As a result, an electric circuit is formed on the print medium. Designated parts will be connected to the terminal portions of the formed electric circuit based on the created circuit diagram.

As described above, the image generation apparatus 110 sets the ink droplet volume as the printing condition based on the print image, obtained based on the created circuit diagram, and the resistance value of the wiring 84, input (calculated) during the creation of the circuit diagram. Then, the image generation apparatus 110 generates print data for printing the print image by using the set ink droplet volume. In this way, it is possible to achieve advantageous effects similar to those by the above-described image generation apparatus 10.

Fifth Embodiment

Figure 20:
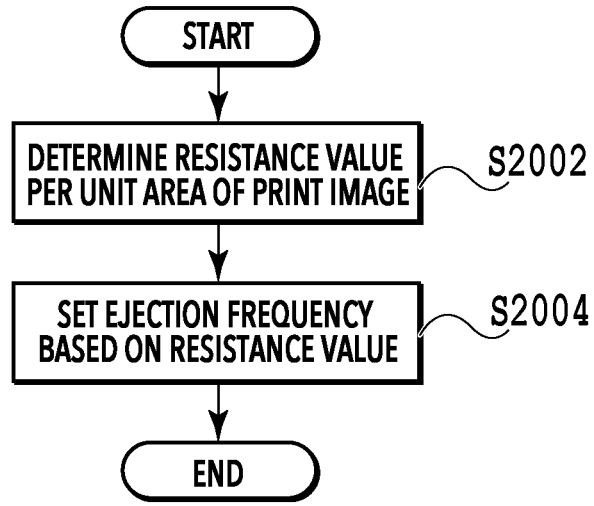
FIG. 20 is a flowchart illustrating a processing routine of a fifth printing condition setting process.

Next, a fifth embodiment of the image generation apparatus according to the present invention will be described with reference to FIG. 20 and FIG. 21. Note that in the following description, as with the image generation apparatus 10, the image generation apparatus according to the fifth embodiment will be described by taking an image formation apparatus as an example. Thus, specific description of components identical or equivalent to those of the above-described image formation apparatus 200 will be omitted as appropriate by using identical reference numerals.

An image generation apparatus 120 (image processing apparatus) according to this fifth embodiment adjusts the resistance value of an electric circuit (wiring 84) by adjusting the ink ejection frequency. The image generation apparatus 120 is connected to a printing apparatus 40 to configure an image formation apparatus 240 that forms an electric circuit on a print medium with the printing apparatus 40. Moreover, the image generation apparatus 120 differs from the above-described image generation apparatus 10 as follows. Specifically, a setting unit 122 provided in a control unit 12 sets the ink ejection frequency as the printing condition. Also, a generation unit 124 generates print data for performing printing based on the ejection frequency set by the setting unit 122.

More specifically, the setting unit 122 sets the ink ejection frequency as the printing condition for exhibiting the set resistance value. Specifically, the setting unit 122 adjusts the amount of ink droplets contacting each other and the time to be taken for ink droplets to contact each other based on the ejection frequency. Here, a larger amount of ink is applied within a shorter time, that is, the amount of ink applied per unit time is larger when the ejection frequency is high than when the ejection frequency is low. In other words, the time taken for ejected ink droplets to contact each other is shorter when the ejection frequency is high than when the ejection frequency is low. Thus, the higher the ejection frequency, the more metal particles will remain on the print medium and the higher the electrical conductivity of the print object will be, that is, the lower the resistance value of the print object will be.

The setting unit 122 holds a plurality of pieces of information on different ejection frequencies. These pieces of information on ejection frequencies are associated with resistance values to be exhibited upon printing (resistance values per unit area) based on the type of metal particle-containing ink to be used and the type of print medium to be used. Then, when setting the printing condition, the setting unit 122 sets the ejection frequency based on these resistance values.

Now, a fifth printing condition setting process executed by the setting unit 122 will be described with reference to FIG. 20. FIG. 20 illustrates a flowchart illustrating a specific processing routine of the fifth printing condition setting process. First, the resistance value to be obtained at each pixel of a print image obtained by an obtaining unit 30 is determined (S2002). Details of the content of the process in S2002 are similar to S702 and specific description thereof will therefore be omitted. Then, the ejection frequency is set based on the determined resistance value (S2004), and the fifth printing condition setting process is then terminated. Specifically, in S2004, the determined resistance value (resistance value per unit area) and the resistance values associated with the held pieces of information on ejection frequencies are compared with each other, and the piece of information on the ejection frequency with which a close resistance value is associated is selected. The piece of information on this ejection frequency is set as the printing condition, so that the ejection frequency for the printing is set.

As described above, the setting unit 122 adjusts the resistance value of the print object to be printed by the printing apparatus 40 by changing the ejection frequency. Thus, in the case of performing printing based on the image data generated by the image generation apparatus 120, the amount of ink used by the printing apparatus 40 remains constant regardless of the ejection frequency.

The generation unit 124 generates print data for printing the print image on a print medium with the printing apparatus 40 based on the print image and the printing condition. Specifically, the generation unit 124 generates the print data by converting each pixel of the print image into an on-off pattern of dots. As with the generation unit 34, a quantization method such as a publicly known error diffusion or dithering method or a dot pattern conversion method is used as the conversion method. Also, the generation unit 124 generates print setting parameters. These print setting parameters include information on the ejection frequency set as the printing condition, in addition to the type and size of the print medium, image processing parameters, and so on.

A case of forming an electric circuit on a print medium by using the image formation apparatus 240 with the above configuration will be described. In a case where a general-purpose personal computer or the like is used as the image generation apparatus 120, an application for executing the functions of the image generation apparatus 120 is installed in the personal computer.

First, the image generation apparatus 120 generates print data for forming an electric circuit on a print medium with the printing apparatus 40 (print data for printing an electric circuit image). The image generation apparatus 120 starts a fifth generation process of generating the print data when the user selects a "print" button 74-4, thereby giving an instruction to print the electric circuit image. As in the first generation process, the fifth generation process may be a process up to the generation of the print data.

Figure 21:
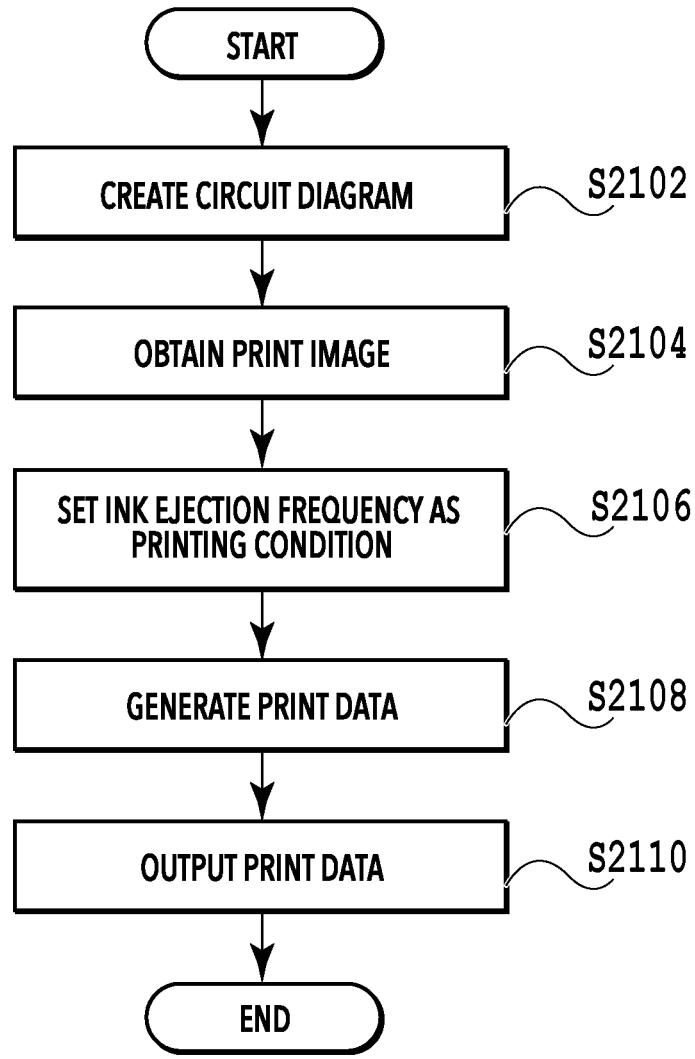
FIG. 21 is a flowchart illustrating a processing routine of a fifth generation process.

Here, a flowchart in FIG. 21 illustrates a processing routine of the fifth generation process, performed by this image generation apparatus 120 to generate the print data for printing the electric circuit image on a print medium. In this fifth generation process, first, a circuit diagram is created based on inputs from the user (S2102). Then, a print image as the electric circuit image to be printed on a print medium is obtained based on size information input by the user and the created circuit diagram (S2104). Details of the contents of the processes in S2102 and S2104 are similar to S1002 and S1004, respectively, and specific description thereof will therefore be omitted.

Then, the ejection frequency as the printing condition for printing the electric circuit image is set based on the resistance value of the wiring 84 (S2106). Specifically, in S2106, the fifth printing condition setting process is performed, in which the setting unit 122 sets the ejection frequency based on the resistance value of the wiring 84 input (calculated) during the creation of the circuit diagram.

Then, print data for printing the electric circuit image with the printing apparatus 40 is generated based on the print image and the printing condition (S2108), and the generated print data is output to the printing apparatus 40 (S2110). The fifth generation process is then terminated. Specifically, in S2108, the generation unit 124 converts each pixel of the print image into an on-off pattern of dots and then generates image data for printing the print image with the converted dot patterns. The generation unit 124 also generates print setting parameters including information on the ejection frequency set as the printing condition.

Then, after the print data is output to the printing apparatus 40, the printing apparatus 40 forms the electric circuit image on a print medium based on the print data. As a result, an electric circuit is formed on the print medium. Designated parts will be connected to the terminal portions of the formed electric circuit based on the created circuit diagram.

As described above, the image generation apparatus 120 sets the ejection frequency as the printing condition based on the print image, obtained based on the created circuit diagram, and the resistance value of the wiring 84, input (calculated) during the creation of the circuit diagram. Then, the image generation apparatus 120 generates print data for printing the print image by using the ejection frequency. In this way, it is possible to achieve advantageous effects similar to those by the above-described image generation apparatus 90.

Other Embodiments

Note that the above-described embodiments may be modified as described in (1) to (6) below.

(1) The object of the present invention can also be achieved as follows. Specifically, a program that implements the function of any of the above-described image generation apparatuses 10, 90, 100, 110, and 120 may be stored (recorded) in a computer-readable storage medium (or record medium). Then, this storage medium is supplied to a system or an apparatus, and this system's or apparatus' computer (or CPU or MPU) may read out and execute the program stored in the storage medium. In this case, the program read out of the storage medium implements the above-described functions (see FIG. 2), and the storage medium storing that program constitutes the present invention.

Also, the function of the image generation apparatus is implemented not only by the computer executing the read program. For example, the present invention also includes a case where an operating system (OS) or the like running on the computer performs part or the entirety of the actual processing based on instructions from that program, and that processing implements the function of the image generation apparatus. The present invention further includes a case where the program read out of the storage medium is written to a memory included in a function extension card inserted in the computer or a function extension unit connected to the computer, a CPU or the like included in that function extension card or function extension unit performs part or the entirety of the actual processing based on instructions from the program, and that processing implements the function of the image generation apparatus.

Figure 22A:
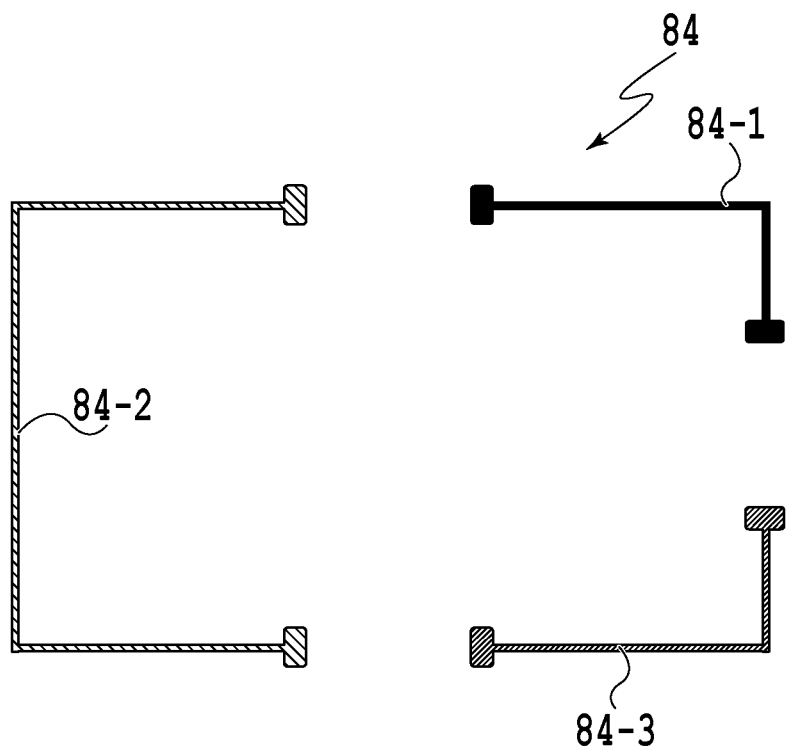
FIG. 22A and FIG. 22B are explanatory diagrams each illustrating a modification of the setting of the tone value in a circuit diagram to be printed.
Figure 22B:
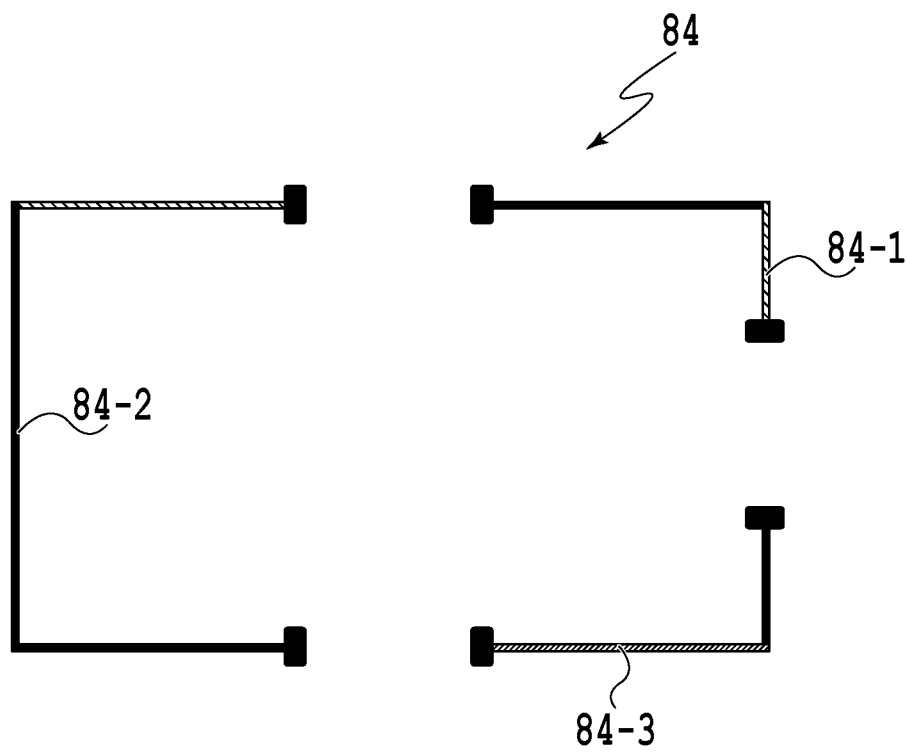

(2) In the above-described first embodiment, the setting unit 32 sets the same tone value for the three wirings 84-1, 84-2, and 84-3. However, the present invention is not limited to this. Specifically, the tone values of the three wirings 84-1, 84-2, and 84-3 may be different from each other. For instance, in the case where the battery 82 is connected in series to the LED lamp 78, as illustrated in FIG. 3A, and the total resistance value of the wiring 84 is 125Ω, the resistance value of the wiring 84-1 may be 20Ω, the resistance value of the wiring 84-2 may be 65Ω, and the resistance value of the wiring 84-3 may be 40Ω, for example. Then, from these resistance values, the resistance value per unit area may be calculated for each wiring, and the tone value may be determined from this resistance value per unit area. If the printing apparatus 40 performs printing based on print data generated based on these tone values, the wirings will be printed with different tones (dot patterns), as illustrated in FIG. 22A, for example. Alternatively, in each of the wirings 84-1, 84-2, and 84-3, the tone value may be different from one region to another, as illustrated in FIG. 22B.

(3) In the above-described embodiments, the printing apparatus 40 is a serial scan-type printing apparatus. However, the present invention is not limited to this. The printing apparatus 40 may be a full line-type printing apparatus. Also, although the printing apparatus 40 is configured to apply only a metal particle-containing ink, the present invention is not limited to this. Specifically, the printing apparatus 40 may be configured to be capable of applying a color ink or a black ink, which contains a color material, an ink which exhibits a different function, or the like in addition to a metal particle-containing ink. For example, in a case where the printing apparatus 40 is configured to apply a metal particle-containing ink and a color ink, any images other than the wiring 84 can be added to the electric circuit image. For example, the names of the parts to be disposed may be printed on blank portions between the wirings with the color ink. In this way, it is possible to prevent the parts from being mounted at wrong positions on the formed electric circuit.

(4) Though not particularly described in the above-described embodiments, the printing apparatus 40 may implement part or the entirety of the function of any of the image generation apparatuses 10, 90, 100, 110, and 120. Note that in this case, the printing apparatus 40 will be provided with a display unit which displays various pieces of information, an operation unit with which the user inputs various pieces of information, and so on as necessary. Also, though not particularly described in the above-described embodiments, the image generation apparatuses 10, 90, 100, 110, and 120 may each be configured of a setting unit and a generation unit. In this case, a print image created by another device and the resistance value of the wiring 84 calculated by another device (or calculated by the user) will be input into the image generation apparatus.

(5) In the above-described third, fourth, and fifth embodiments, a piece of information (mask patterns, ink droplet volume, and ejection frequency) with which a close resistance value is associated is selected and set as the printing condition. However, the present invention is not limited to this. Specifically, settable resistance values may be sorted into a plurality of levels, a piece of information may be set to each level, and the piece of information set to the level to which the determined resistance value belongs may be set as the print information. Also, in the above-described embodiments, the image formation apparatuses 200, 210, 220, 230, and 240 print an electric circuit image with the printing apparatus 40. However, the present invention is not limited to this. Specifically, an image of a print object desired to be formed have electrical conductivity may be printed with the printing apparatus 40.

(6) In the above-described embodiments, the tone value, the number of passes, the mask patterns, the ink droplet volume, and the ejection frequency are changed as the printing condition. However, the present invention is not limited to this. Specifically, the tone value, the number of passes, the mask patterns, the ink droplet volume, and the ejection frequency may be combined as the printing condition.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-136994 filed Jul. 13, 2017, which is hereby incorporated by reference wherein in its entirety.

What is claimed is:

1. An image processing apparatus for generating print data for printing an electrically conductive print image on a print medium by ejecting a metal particle-containing ink from ejection device, the image processing apparatus comprising:
   an obtaining unit configured to obtain resistance information relating to a resistance value of the electrically conductive print image;
   a setting unit configured to set a printing condition based on the resistance information so as to change an amount of ink droplets of the metal particle-containing ink to be united before the ink droplets have permeated the print medium; and
   a generation unit configured to generate the print data for ejecting the metal particle-containing ink based on (a) image data for the electrically conductive print image and (b) the printing condition.

2. The image processing apparatus according to claim 1, wherein an amount of the metal particle-containing ink to be applied onto the print medium corresponding to the generated print data changes as the printing condition is changed.

3. The image processing apparatus according to claim 1, wherein an amount of the metal particle-containing ink to be applied onto the print medium corresponding to the generated print data remains constant as the printing condition is changed.

4. The image processing apparatus according to claim 1, wherein the setting unit sets the printing condition so that a print tone becomes lower as the resistance value of the electrically conductive print image becomes larger, and the print tone becomes higher as the resistance value becomes smaller.

5. The image processing apparatus according to claim 1, wherein the setting unit sets the printing condition so that a number of passes over a predetermined area of the print medium becomes larger as the resistance value of the electrically conductive print image becomes larger, and the number of passes over the predetermined area becomes smaller as the resistance value becomes smaller.

6. The image processing apparatus according to claim 1, wherein the setting unit sets the printing condition so that mask patterns for a predetermined area of the print medium are set so that print density is more even between passes as the resistance value of the electrically conductive print image becomes larger, and the print density is more different and uneven between passes as the resistance value becomes smaller.

7. The image processing apparatus according to claim 1, wherein the setting unit sets the printing condition so that a metal particle-containing ink droplet volume becomes smaller as the resistance value of the electrically conductive print image becomes larger, and the metal particle-containing ink droplet volume becomes larger as the resistance value becomes smaller.

8. The image processing apparatus according to claim 1, wherein the setting unit sets the printing condition so that an ejection frequency becomes lower as the resistance value of the electrically conductive print image becomes larger, and the ejection frequency becomes higher as the resistance value becomes smaller.

9. The image processing apparatus according to claim 1, wherein a number of ink droplets of the metal particle-containing ink to be united per unit area changes as the printing condition is changed.

10. The image processing apparatus according to claim 1, wherein the obtaining unit obtains a sheet resistance value as the resistance information.

11. The image processing apparatus according to claim 10, wherein the sheet resistance value is obtained based on a total resistance value of a wiring to be printed with the metal particle containing ink, a length of the wiring, and a width of the wiring.

12. The image processing apparatus according to claim 11, wherein the length of the wiring and the width of the wiring in the generated print data are equal to the length of the wiring and the width of the wiring in the electrically conductive print image before the setting unit sets the printing condition.

13. An image processing method for generating print data for printing an electrically conductive print image on a print medium by ejecting a metal particle-containing ink from ejection device, the image processing method comprising:
an obtaining step of obtaining a resistance information relating to a resistance value of the electrically conductive print image;
a setting step of setting a printing condition based on the resistance information so as to change an amount of ink droplets of the metal particle-containing ink to be united before the ink droplets have permeated the print medium; and
a generation step of generating the print data for ejecting the metal particle-containing ink based on (a) image data for the electrically conductive print image and (b) the printing condition.

14. The image processing method according to claim 13, wherein an amount of the metal particle-containing ink to be applied onto the print medium corresponding to the generated print data changes as the printing condition is changed.

15. The image processing method according to claim 13, wherein an amount of the metal particle-containing ink to be applied onto the print medium corresponding to the generated print data remains constant as the printing condition is changed.

16. The image processing method according to claim 13, wherein in the setting step, the printing condition is set so that a print tone becomes lower as the resistance value of the electrically conductive print image becomes larger, and the print tone becomes higher as the resistance value becomes smaller.

17. The image processing method according to claim 13, wherein in the setting step, the printing condition is set so that a number of passes over a predetermined area of the print medium becomes larger as the resistance value of the electrically conductive print image becomes larger, and the number of passes over the predetermined area becomes smaller as the resistance value becomes smaller.

18. The image processing method according to claim 13, wherein in the setting step, the printing condition is set so that mask patterns for a predetermined area of the print medium are set so that print density is more even between passes as the resistance value of the electrically conductive print image becomes larger, and the print density is more different and uneven between passes as the resistance value becomes smaller.

19. The image processing method according to claim 13, wherein in the setting step, the printing condition is set so that a metal particle-containing ink droplet volume becomes smaller as the resistance value of the electrically conductive print image becomes larger, and the metal particle-containing ink droplet volume becomes larger as the resistance value becomes smaller.

20. The image processing method according to claim 13, wherein in the setting step, the printing condition is set so that an ejection frequency becomes lower as the resistance value of the electrically conductive print image becomes larger, and the ejection frequency becomes higher as the resistance value becomes smaller.

21. The image processing method according to claim 13, wherein a number of ink droplets of the metal particle-containing ink to be united per unit area changes as the printing condition is changed.

22. The image processing method according to claim 13, wherein in the obtaining step, a sheet resistance value is obtained as the resistance information.

23. The image processing method according to claim 22, wherein the sheet resistance value is obtained based on a total resistance value of a wiring to be printed with the metal particle containing ink, a length of the wiring, and a width of the wiring.

24. The image processing method according to claim 23, wherein the length of the wiring and the width of the wiring in the generated print data are equal to the length of the wiring and the width of the wiring in the electrically conductive print image before the printing condition is set.

25. A non-transitory computer readable storage medium storing a program for causing a computer to perform an image processing method for generating print data for printing an electrically conductive print image on a print medium by ejecting a metal particle-containing ink from ejection device, the method comprising:
an obtaining step of obtaining a resistance information relating to a resistance value of the electrically conductive print image;
a setting step of setting a printing condition based on the resistance information so as to change an amount of ink droplets of the metal particle-containing ink to be united before the ink droplets have permeated the print medium; and a generation step of generating the print data for ejecting the metal particle-containing ink based on (a) image data for the electrically conduction print image and (b) the printing condition.

\* \* \* \* \*